US012648324B2

(12) United States Patent
Yoo et al.

(10) Patent No.: US 12,648,324 B2
(45) Date of Patent: Jun. 2, 2026

(54) DISPLAY DEVICE AND MOBILE ELECTRONIC DEVICE INCLUDING THE SAME

(71) Applicant: Samsung Display Co., Ltd., Yongin-Si (KR)

(72) Inventors: Byung Han Yoo, Yongin-si (KR); Jung Woo Park, Yongin-si (KR); Hyang A Park, Yongin-si (KR); Dae Young Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 449 days.

(21) Appl. No.: 18/211,607

(22) Filed: Jun. 20, 2023

(65) Prior Publication Data

US 2024/0122021 A1     Apr. 11, 2024

(30) Foreign Application Priority Data

Oct. 11, 2022 (KR) ........................ 10-2022-0130096
Apr. 18, 2023 (KR) ........................ 10-2023-0051033

(51) Int. Cl.
*H10K 59/35* (2023.01)
*G06V 40/13* (2022.01)
*H10K 59/122* (2023.01)
*H10K 59/65* (2023.01)

(52) U.S. Cl.
CPC ....... *H10K 59/353* (2023.02); *G06V 40/1318* (2022.01); *H10K 59/122* (2023.02); *H10K 59/65* (2023.02)

(58) Field of Classification Search
CPC .... H10K 59/353; H10K 59/65; H10K 59/122; G06V 40/1318
See application file for complete search history.

(56) References Cited

U.S. PATENT DOCUMENTS

2020/0133414 A1 * 4/2020 Lee ........................ G06F 3/044
2023/0345767 A1 10/2023 Song et al.
2024/0130164 A1 4/2024 Yoo et al.

FOREIGN PATENT DOCUMENTS

CN         107480639 A   12/2017
CN         112701224 A    4/2021
CN         114156284 A    3/2022
KR     10-1992914 B1      6/2019
KR  10-2024-0054457 A     4/2024

* cited by examiner

*Primary Examiner* — Anne M Hines
(74) *Attorney, Agent, or Firm* — Innovation Counsel LLP

(57) ABSTRACT

According to an embodiment, a display device may include a display panel which may include a display area and a non-display area. The display panel may include a first subpixel including a first light emitting area, a second subpixel including a second light emitting area, a third subpixel including a third light emitting area, a sensor pixel including a light sensing area, a pixel defining layer separating the first through third light emitting areas and the light sensing area, and a partition wall disposed on the pixel defining layer to surround the sensor pixel.

20 Claims, 14 Drawing Sheets

PX: PX1, PX2, PX3

PX: PX1, PX2, PX3

PX: PX1, PX2, PX3

PX: PX1, PX2, PX3

DISPLAY DEVICE AND MOBILE ELECTRONIC DEVICE INCLUDING THE SAME

This application claims priority to Korean Patent Application No. 10-2022-0130096, filed on Oct. 11, 2022, in the Korean Intellectual Property Office and to Korean Patent Application No. 10-2023-0051033 filed on Apr. 18, 2023, in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a display device and a mobile electronic device including the same.

2. Description of the Related Art

As the information society develops, demands for display devices for displaying images are increasing in various fields. Display devices are applied to various electronic devices such as smartphones, digital cameras, notebook computers, tablet personal computers (PCs), navigation devices, and smart televisions. A mobile electronic device such as a smartphone or a tablet PC provides various functions such as image capturing, fingerprint recognition, and face recognition.

In recent years, devices for acquiring biometric information such as skin moisture level or blood pressure and information for component of fruit or vegetables in an oscillometric manner using a photosensor have been developed with the development of the optical industry and the semiconductor industry.

However, oscillometric component measuring devices using a photosensor require an independent light source, a sensor and a display device, and a portable smartphone or tablet PC for executing an application program has to be additionally carried. In this regard, recently, methods for integrating a component measuring device using a photosensor with a mobile electronic device have been proposed.

SUMMARY

Aspects of the present disclosure provide a display device having improved portability and convenience by embedding a photosensor in a display panel and a mobile electronic device including the display device.

Aspects of the present disclosure also provide a display device having improved sensing performance by reducing a leakage current between a photosensor and a pixel adjacent to the photosensor and a mobile electronic device including the display device.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device may include a display panel which may include a display area and a non-display area. The display panel may include a first subpixel including a first light emitting area, a second subpixel including a second light emitting area, a third subpixel including a third light emitting area, a sensor pixel including a light sensing area, a pixel defining layer separating the first through third light emitting areas and the light sensing area, and a partition wall disposed on the pixel defining layer to completely surround the sensor pixel.

The first subpixel may include a first light emitting layer disposed in the first light emitting area and on a portion of the pixel defining layer adjacent to the first light emitting area. The second subpixel may include a second light emitting layer disposed in the second light emitting area and on a portion of the pixel defining layer adjacent to the second light emitting area. The third subpixel may include a third light emitting layer disposed in the third light emitting area and on a portion of the pixel defining layer adjacent to the third light emitting area. The sensor pixel may include a photoelectric conversion layer disposed in the light sensing area and on a portion of the pixel defining layer adjacent to the light sensing area.

The first through third subpixels may be repeatedly arranged along a first direction and a second direction to be arranged in a matrix form. The sensor pixel may be disposed adjacent to the first through third subpixels and detects a user's biometric information using at least one of red light emitted from the first subpixel, green light emitted from the second subpixel, and blue light emitted from the third subpixel.

The biometric information may include fingerprint information, iris information, blood pressure information, and blood flow information.

The first subpixel and the third subpixel may be alternately arranged in a k-th row along a first direction. The second subpixels may be arranged in each of $(k-1)$-th and $(k+1)$-th rows along the first direction. The sensor pixel may be disposed between the first subpixel and the third subpixel in the k-th row.

The second subpixel and the sensor pixel may be alternately arranged in a column along a second direction perpendicular to the first direction.

The sensor pixel may include a first sensor pixel which detects the blood pressure information and the blood flow information using the red light emitted from the first subpixel and the blue light emitted from the third subpixel.

The sensor pixel may include a second sensor pixel which detects the fingerprint information using the green light emitted from the second subpixel.

The partition wall surrounding the second sensor pixel may have a uniform height.

The photoelectric conversion layer of the sensor pixel may include a green overlap area overlapping a portion of the second light emitting layer on the pixel defining layer and a non-overlap area other than the green overlap area.

A portion of the partition wall crosses a deposition area of the second light emitting layer on the pixel defining layer. A dummy organic material formed through the same process as the second light emitting layer may be disposed on the portion of the partition wall.

A cathode may be disposed on the dummy organic material on the partition wall. The cathode located on the partition wall may be connected to the cathode disposed in the first through third light emitting areas and the light sensing area.

According to an embodiment of the present disclosure, a mobile electronic device may include a display panel in which a photosensor is embedded. The display panel may include a first subpixel including a first light emitting area, a second subpixel including a second light emitting area, a third subpixel including a third light emitting area, a sensor pixel including a light sensing area, a pixel defining layer separating the first through third light emitting areas and the light sensing area, and a partition wall disposed on the pixel defining layer to completely surround the sensor pixel.

The first subpixel may include a first light emitting layer disposed in the first light emitting area and on a portion of the pixel defining layer adjacent to the first light emitting area. The second subpixel may include a second light emitting layer disposed in the second light emitting area and on a portion of the pixel defining layer adjacent to the second light emitting area. The third subpixel may include a third light emitting layer disposed in the third light emitting area and on a portion of the pixel defining layer adjacent to the third light emitting area. The sensor pixel may include a photoelectric conversion layer disposed in the light sensing area and on a portion of the pixel defining layer adjacent to the light sensing area.

The first through third subpixels may be repeatedly arranged along a first direction and a second direction to be arranged in a matrix form. The sensor pixel may be disposed adjacent to the first through third subpixels and detects a user's biometric information using at least one of red light emitted from the first subpixel, green light emitted from the second subpixel, and blue light emitted from the third subpixel.

The first subpixel and the third subpixel may be alternately arranged in a k-th row along a first direction. The second subpixels may be arranged in each of (k−1)-th and (k+1)-th rows along the first direction, and the sensor pixel is disposed between the first subpixel and the third subpixel in the k-th row.

The sensor pixel may include a first sensor pixel which detects blood pressure information and blood flow information using the red light emitted from the first subpixel and the blue light emitted from the third subpixel.

According to an embodiment of the present disclosure, a display panel which comprises a display area and a non-display area, wherein the display panel may include a first subpixel comprising a first light emitting area disposed in a k-th row, a second subpixel comprising a second light emitting area, a third subpixel comprising a third light emitting area disposed in the k-th row, a sensor pixel comprising a light sensing area, a pixel defining layer separating the first light emitting area, a second light emitting area, a through third light emitting areas, and the light sensing area, and a partition wall disposed on the pixel defining layer to surround the sensor pixel. The partition wall may include a first partition wall portion disposed on the pixel defining layer between a portion of the photoelectric conversion layer of the sensor pixel and a portion of the first light emitting layer of the first subpixel and a second partition wall portion be disposed on the pixel defining layer between a portion of the photoelectric conversion layer of the sensor pixel and a portion of the third light emitting layer of the third subpixel. A predetermined gap may be disposed between the first partition wall portion and the second partition wall portion to form a first slit disposed between the sensor pixel and the second subpixel in a (k−1)-th row and a second slit disposed between the sensor pixel and the second subpixel in a (k+1)-th row.

The partition wall is completely removed in areas corresponding the first slit and the second slit.

The photoelectric conversion layer of the sensor pixel comprises a green overlap area overlapping a portion of the second light emitting layer on the pixel defining layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, specific embodiments will be described with reference to the accompanying drawings.

Figure 1:
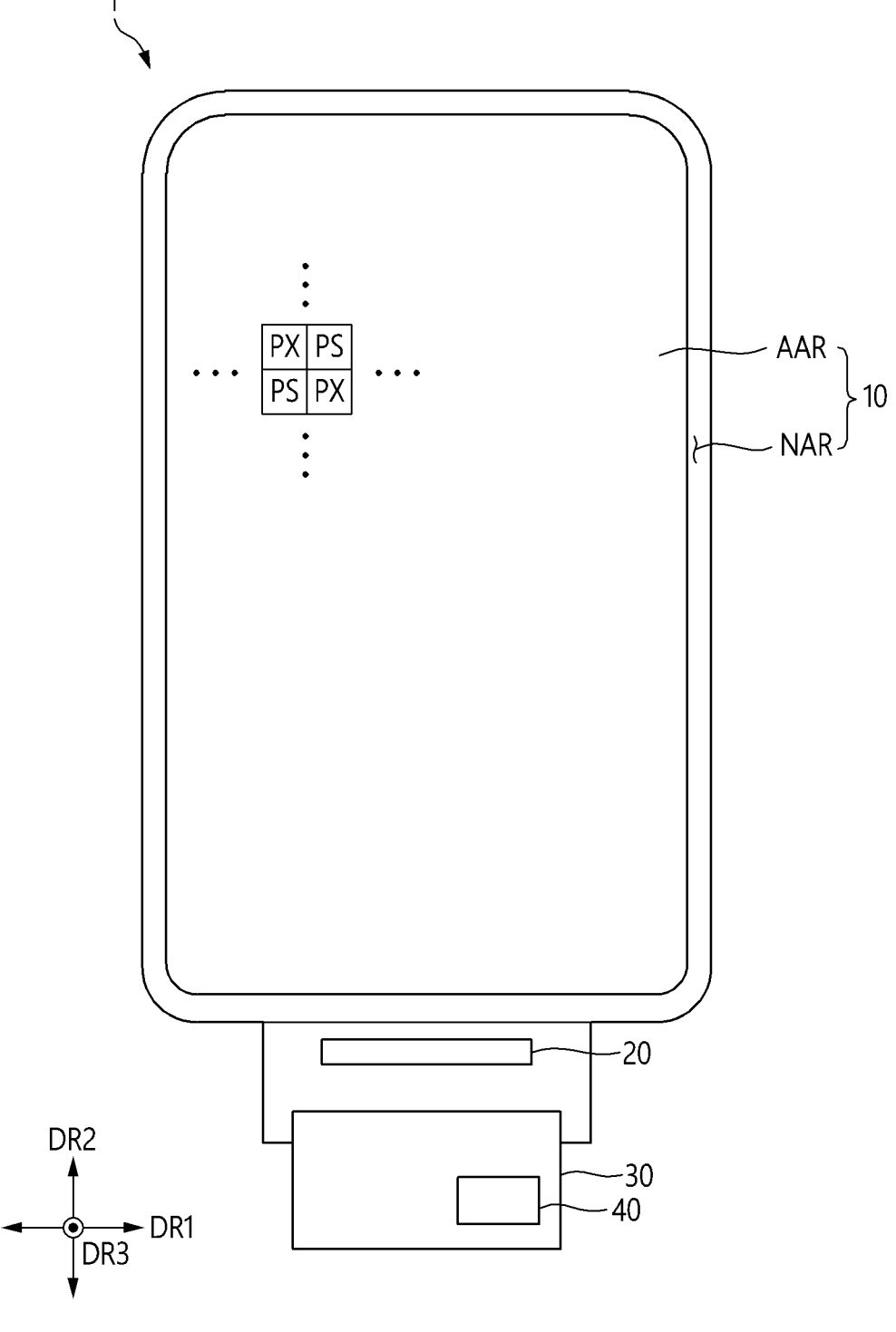
FIG. 1 is a plan view of a display device included in a mobile electronic device according to an embodiment.

FIG. 1 is a plan view of a display device included in a mobile electronic device 1 according to an embodiment.

In FIG. 1, a first direction DR1, a second direction DR2, and a third direction DR3 are defined. The first direction DR1 may be a direction parallel to a side of the mobile electronic device 1 when seen in a plan view, for example, a horizontal direction of the mobile electronic device 1. The second direction DR2 may be a direction parallel to another side in contact with the above side of the mobile electronic device 1 when seen in a plan view, for example, a vertical direction of the mobile electronic device 1. For ease of description, one side in the first direction DR1 refers to a right direction in a plan view, the other side in the first direction DR1 refers to a left direction in a plan view, one side in the second direction DR2 refers to an upward direction in a plan view, and the other side in the second direction DR2 refers to a downward direction in a plan view. The third direction DR3 may be a thickness direction of the mobile electronic device 1. However, directions mentioned in embodiments should be understood as relative directions, and the embodiments are not limited to the mentioned directions.

The terms "upper" and "upper surface" used herein based on the third direction DR3 refer to a display surface side of a display panel 10, and the terms "lower," "lower surface" and "back surface" refer to an opposite side of the display panel 10 from the display surface side.

Referring to FIG. 1, examples of the mobile electronic device 1 may include various electronic devices that provide a display screen. Examples of the mobile electronic device 1 may include, but are not limited to, a mobile phone, a smartphone, a tablet personal computer (PC), a mobile communication terminal, an electronic notebook, an electronic book, a personal digital assistant (PDA), a portable multimedia player (PMP), a navigation device, an ultramobile PC (UMPC), a television, a game console, a wristwatch-type electronic device, a head mounted display, a monitor of a PC, a notebook computer, a car dashboard, a digital camera, a camcorder, an outdoor billboard, an electronic display board, various medical devices, various examination devices, various home appliances including a display area such as a refrigerator and a washing machine, and an Internet of things (IoT) device. A representative example of the mobile electronic device 1 to be described below may be, but is not limited to, a smartphone, a tablet PC, or a notebook computer.

The mobile electronic device 1 may include a display device including the display panel 10, a panel driving circuit 20, a circuit board 30, and a readout circuit 40.

The display device of the mobile electronic device 1 includes the display panel 10 including an active area AAR and a non-active area NAR. The active area AAR includes a display area in which an image is displayed. The active area AAR may completely overlap the display area. A plurality of display pixels PX displaying an image may be disposed in the display area. Each display pixel PX may include a light emitting element EL (see FIG. 4). The active area AAR may be referred to as the "display area".

The active area AAR further includes a biosensor area. The biosensor area is an area that reacts to light and an area configured to sense the amount or wavelength of incident light. The biosensor area may overlap the display area. For example, the biosensor area may be disposed only in a limited area necessary for fingerprint recognition and/or iris recognition within the active area AAR. In this case, the biosensor area may overlap a part of the display area but may not overlap the other part of the display area. In another example, the biosensor area may be defined as an area exactly the same as the active area AAR. In this case, the entire active area AAR may be utilized as an area for fingerprint detection and/or iris recognition. A plurality of sensor pixels PS that react to light may be disposed in the biosensor area. Each of the sensor pixels PS may include a photoelectric converter PD (see FIG. 4) that senses incident light and converts the incident light into an electrical signal. The biosensor area may refer to an area where photo sensors are disposed. The photosensors may be configured to acquire a user's biometric information and may be embedded inside the display panel 10. The biometric information includes fingerprint information, iris information, blood pressure information, and blood flow information.

The non-active area NAR is disposed around the active area AAR. The non-active area NAR may be a bezel area. The non-active area NAR may surround all sides (four sides in the drawing) of the active area AAR, but the present disclosure is not limited thereto. The non-active area NAR may be referred to as a "non-display area".

The non-active area NAR may be disposed around the active area AAR. The panel driving circuit 20 may be disposed in the non-active area NAR. The panel driving circuit may drive the display pixels PX and/or the sensor pixels PS. The panel driving circuit may output signals and voltages for driving the display panel 10. The panel driving circuit 20 may be formed as an integrated circuit and mounted on the display panel 10. In the non-active area NAR, signal lines for transmitting signals between the panel driving circuit 20 and the display pixels PX and/or the sensor pixels PS disposed in the active area AAR may be further disposed. In another example, the panel driving circuit 20 may be mounted on the circuit board 30.

Signal lines or the readout circuit 40 for transmitting signals to the display pixels PX and/or the sensor pixels PS disposed in the active area AAR may be disposed in the non-active area NAR. The readout circuit 40 may be connected to each sensor pixel PS through a sensor signal line and may receive a current flowing through each sensor pixel PS to detect a user's fingerprint input. The readout circuit 40 may be formed as an integrated circuit and attached onto a display circuit board using a chip on film (COF) method. However, the present disclosure is not limited thereto, and the readout circuit 40 may also be attached onto the non-active area NAR of the display panel 10 using a chip on glass (COG) method, a chip on plastic (COP) method, or an ultrasonic bonding method.

The circuit board 30 may be attached to an end of the display panel 10 using an anisotropic conductive film (ACF). Lead lines of the circuit board 30 may be electrically connected to a pad unit of the display panel 10 which includes a plurality of pads. The circuit board 30 may be a flexible printed circuit board or a flexible film such as a chip on film.

Figure 2:
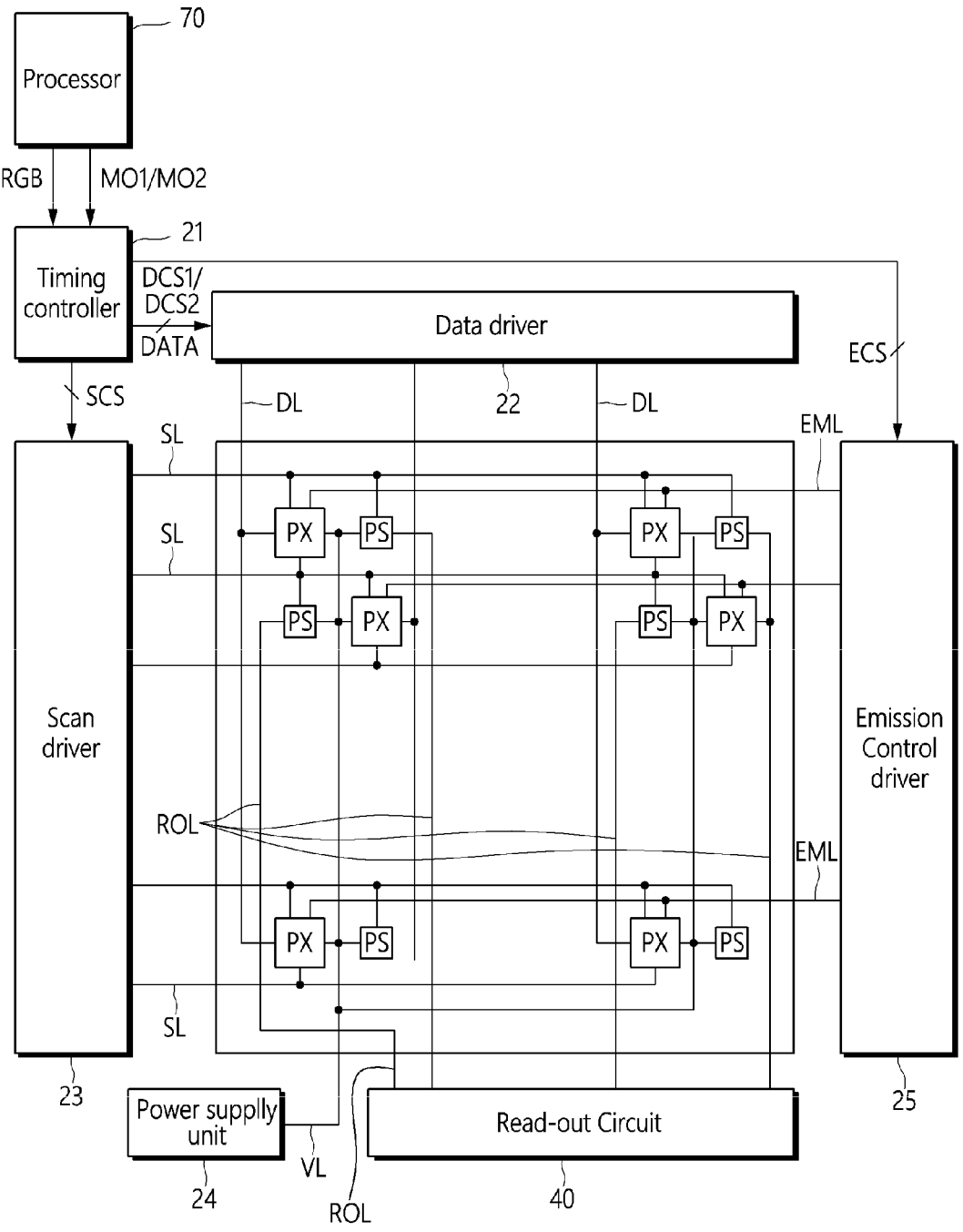
FIG. 2 is a block diagram of the mobile electronic device according to the embodiment.

FIG. 2 is a block diagram of the mobile electronic device 1 according to the embodiment.

Referring to FIG. 2, the mobile electronic device 1 includes a processor 70, the panel driving circuit 20, and the readout circuit 40.

The processor 70 supplies an image signal RGB received from the outside and a plurality of control signals to a timing controller 21. The processor 70 may further include a graphics processing unit (GPU) that provides graphics for the image signal RGB received from the outside. The image signal RGB may be provided to the timing controller 21 as an image source for which graphics processing has been completed by the GPU. The image signal RGB may have a frequency of, for example, 1 to 120 Hz.

The control signals supplied by the processor 70 include a first mode control signal MO1, a second mode control signal MO2, a clock signal, and an enable signal.

The first mode control signal MO1 may include a signal for displaying a normal image. The second mode control signal MO2 may include a sensing mode signal for sensing biometric information (e.g., fingerprint F or iris information). The second mode control signal MO2 may include signals for controlling a plurality of frame periods. For example, the second mode control signal MO2 may be a signal for controlling the display panel 10 to be driven during a first frame period and a second frame period. Specifically, the second mode control signal MO2 may be a signal for controlling some display pixels PX to emit light and other display pixels PX not to emit light during the first frame period. In addition, the second mode control signal MO2 may be a signal for controlling information of the fingerprint F of a finger or iris to be read through digital sensing data detected by some sensor pixels PS in the first frame period and controlling digital sensing data detected by other sensor pixels PS to be excluded.

A case where biometric information acquired by the mobile electronic device 1 using the sensor pixels PS is the fingerprint F of a finger will be mainly described below. However, the present disclosure is not limited thereto. For example, the mobile electronic device 1 may detect iris information included in a user's eyeball using the sensor pixels PS and may also detect various biometric information such as blood pressure, blood flow, and heart rate.

The processor 70 provides the first mode control signal MO1 to the timing controller 21 to display an image on the display panel 10. The processor 70 provides the second mode control signal MO2 to the timing controller 21 to detect a user's fingerprint. The timing controller 21 drives the display pixels PX according to the first mode control signal MO1 and the sensor pixels PS of the display panel 10 according to the second mode control signal MO2.

The panel driving circuit 20 includes a data driver 22 which drives the display pixels PX of the display panel 10, a scan driver 23 which drives the display pixels PX and the sensor pixels PS, and the timing controller 21 which controls driving timing of the data driver 22 and the scan driver 23. In addition, the panel driving circuit 20 may further include a power supply unit 24 and an emission control driver 25.

The timing controller 21 receives an image signal from a host (e.g., a processor) of the mobile electronic device 1. The timing controller 21 may output image data DATA and a data control signal DCS to the data driver 22. In addition, the timing control unit 21 may generate a scan control signal SCS for controlling the operation timing of the scan driver 23 and an emission control driving signal ECS for controlling the operation timing of the emission control driver 25. For example, the timing controller 21 may generate the scan control signal SCS and the emission control driving signal ECS and output the scan control signal SCS to the scan driver 23 through a scan control line and the emission control driving signal ECS to the emission control driver 25 through an emission control driving line.

The timing controller 21 may generate a first data control signal DCS1 when receiving the first mode control signal MO1 from the processor 70. The timing controller 21 may output the first data control signal DCS1 to the data driver 22. In addition, the timing controller 21 may generate a second data control signal DCS2 when receiving the second mode control signal MO2 from the processor 70. The timing controller 21 may output the second data control signal DCS2 to the data driver 22. The second data control signal MO2 may be a signal that controls the first frame period and the second frame period to alternate.

The data driver 22 may convert the image data DATA into analog data voltages and output the analog data voltages to data lines DL. The scan driver 23 may generate scan signals in response to the scan control signal SCS and sequentially output the scan signals to scan lines SL.

The power supply unit 24 may generate a driving voltage ELVDD (see FIG. 4) and supply the driving voltage ELVDD to a power voltage line VL. In addition, the power supply unit 24 may generate a common voltage ELVSS (see FIG. 4) and supply the common voltage ELVSS to the power voltage line VL. The power voltage line VL may include a driving voltage line and a common voltage line. The driving voltage ELVDD may be a high potential voltage for driving light emitting elements and photoelectric converters, and the common voltage ELVSS may be a low potential voltage for driving the light emitting elements and the photoelectric converters. That is, the driving voltage ELVDD may have a higher electric potential than the common voltage ELVSS.

The emission control driver 25 may generate emission control signals in response to the emission control driving signal ECS and sequentially output the emission control signals to emission control lines EML. Although the emission control driver 25 is illustrated as being separate from the scan driver 23, the present disclosure is not limited thereto, and the emission control driver 25 may also be embedded in the scan driver 23.

The readout circuit 40 may be connected to each sensor pixel PS through a readout line ROL and may receive a current flowing through each sensor pixel PS to detect a user's fingerprint input. The readout circuit 40 may generate digital sensing data according to the magnitude of a current sensed by each sensor pixel PS and transmit the digital sensing data to the processor 70. The processor 70 may analyze the digital sensing data and determine whether the digital sensing data matches a user's fingerprint by comparing the digital sensing data with a preset fingerprint. When the preset fingerprint and the digital sensing data transmitted from the readout circuit 40 are the same, preset functions may be performed.

The display panel 10 includes a plurality of display pixels PX, a plurality of sensor pixels PS, a plurality of scan lines SL connected to the display pixels PX and sensor pixels PS, a plurality of data lines DL and a plurality of emission control lines EML connected to the display pixels PX, and a plurality of readout lines ROL connected to the sensor pixels PS.

Each of the display pixels PX may be connected to at least one of the scan lines SL, one of the data lines DL, one of the emission control lines EML, and the power voltage line VL.

Each of the sensor pixels PS may be connected to one of the scan lines SL, one of the readout lines ROL, and the power voltage line VL.

The scan lines SL may connect the scan driver 23 to the display pixels PX and the sensor pixels PS. The scan lines SL may provide scan signals output from the scan driver 23 to the display pixels PX and the sensor pixels PS.

The data lines DL may connect the data driver 22 to the display pixels PX. The data lines DL may provide image data output from the data driver 22 to the display pixels PX.

The emission control lines EML may connect the emission control driver 25 to the display pixels PX. The emission control lines EML may provide emission control signals output from the emission control driver 25 to the display pixels PX.

The readout lines ROL may connect the sensor pixels PS to the readout circuit 40. The readout lines ROL may provide a sensing current generated according to a photocurrent output from each of the sensor pixels PS to the readout circuit 40. Accordingly, the readout circuit 40 may detect a user's fingerprint.

A plurality of power voltage lines VL may connect the power supply unit 24 to the display pixels PX and the sensor pixels PS. The power voltage lines VL may provide the driving voltage ELVDD or the common voltage ELVSS received from the power supply unit 24 to the display pixels PX and the sensor pixels PS.

Figure 3:
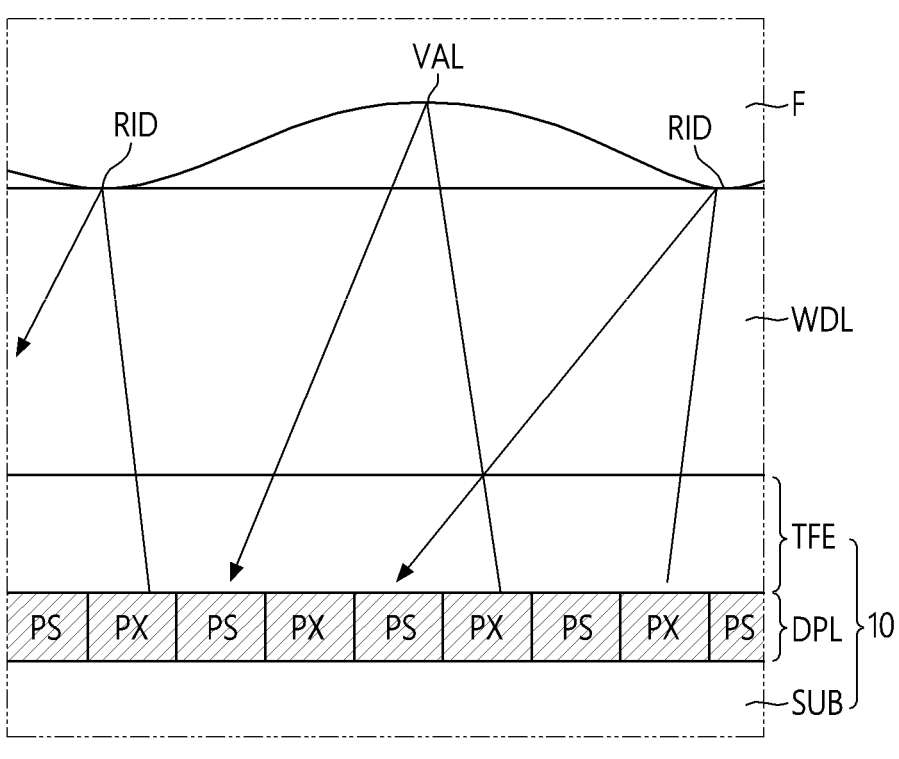
FIG. 3 is an example diagram illustrating fingerprint detection of the display device according to the embodiment.
Figure 3:

FIG. 3 is an example diagram illustrating fingerprint detection of the display device according to the embodiment. FIG. 3 illustrates how the display device detects a fingerprint. However, the display device may also acquire biometric information such as iris information, blood pressure, or heart rate in a similar way.

Referring to FIG. 3, the mobile electronic device 1 may further include a window WDL disposed on the display panel 10. The display panel 10 may include a substrate SUB, a display layer DPL disposed on the substrate SUB and including the display pixels PX and the sensor pixels PS, and an encapsulation layer TFE disposed on the display layer DPL.

When a user's finger touches an upper surface of the window WDL of the mobile electronic device 1, light output from the display pixels PX of the display panel 10 may be reflected by ridges RID of the user's fingerprint F and valleys VAL between the ridges RID. In this case, the ridge portions RID of the fingerprint F contact the upper surface of the window WDL, but the valley portions VAL of the fingerprint F do not contact the window WDL. That is, the upper surface of the window WDL contacts air in the valley portions VAL.

Since a refractive index of a finger in which the fingerprint F are disposed and a refractive index of air are different, the amount of light reflected by the ridges RID and the amount of light reflected by the valleys VAL of the fingerprint F may be different. Accordingly, the ridge portions RID and the valley portions VAL of the fingerprint F may be detected based on a difference in the amount of reflected light, that is, a difference in the amount of light incident on each sensor pixel PS. Since each sensor pixel PS outputs an electrical signal (i.e., a sensing current) according to the difference in the amount of the reflected light, a fingerprint pattern of the finger can be identified.

When a sensor pixel PS adjacent to a plurality of display pixels PX outputs a sensing current, a portion of an emission current required for the display pixels PX to emit light may leak to the sensor pixel PS adjacent to the display pixels PX. Accordingly, the sensing current of the sensor pixel PS adjacent to the display pixels PX may change, and a fingerprint pattern of the finger may be incorrectly identified. This will be described below with reference to FIG. 4.

Figure 4:
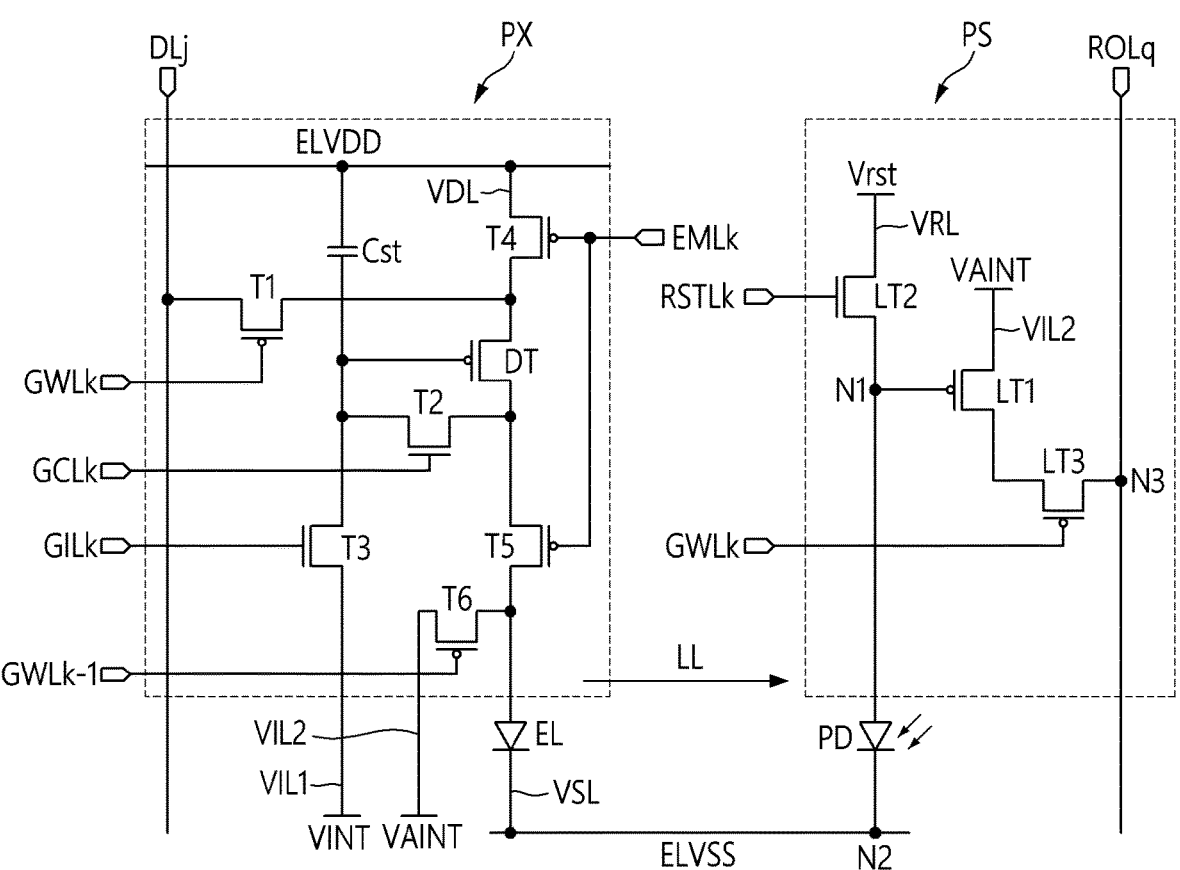
FIG. 4 is a circuit diagram of a pixel and a photosensor according to an embodiment.

FIG. 4 is a circuit diagram of a display pixel PX and a sensor pixel PS according to an embodiment.

In FIG. 4, a circuit diagram of a display pixel PX connected to a $k^{th}$ scan initialization line GILk, a $k^{th}$ scan line GWLk, a $k^{th}$ scan control line GCLk, a $(k-1)^{th}$ scan line GWLk-1 and a $j^{th}$ data line DLj, and a sensor pixel PS connected to the $k^{th}$ scan line GWLk, a $k^{th}$ reset control line RSTLk and a $q^{th}$ readout line ROLq is illustrated.

The display pixel PX may include a light emitting element EL, a plurality of switch elements, and a first capacitor Cst. The light emitting element EL includes a light emitting portion that emits light.

A driving transistor DT may include a gate electrode, a first electrode, and a second electrode. The driving transistor DT controls a drain-source current Ids (hereinafter, referred to as a "driving current") flowing between the first electrode and the second electrode according to a data voltage applied to the gate electrode. The driving current Ids flowing through a channel of the driving transistor DT is proportional to the square of a difference between a voltage Vgs between the first electrode and the gate electrode of the driving transistor DT and a threshold voltage as shown in Equation 1.

$$Ids = k' \times (V_{g3} - Vth)^2 \tag{1}$$

where Isd is a driving current, i.e., a source-drain current flowing through the channel of the driving transistor DT, k' is a proportional coefficient determined by the structure and physical characteristics of the driving transistor, Vgs is a voltage between the first electrode and the gate electrode of the driving transistor, and Vth is a threshold voltage of the driving transistor.

The light emitting element EL emits light according to the driving current Isd. The amount of light emitted from the light emitting element EL may increase as the driving current Ids increases.

Figure 6:
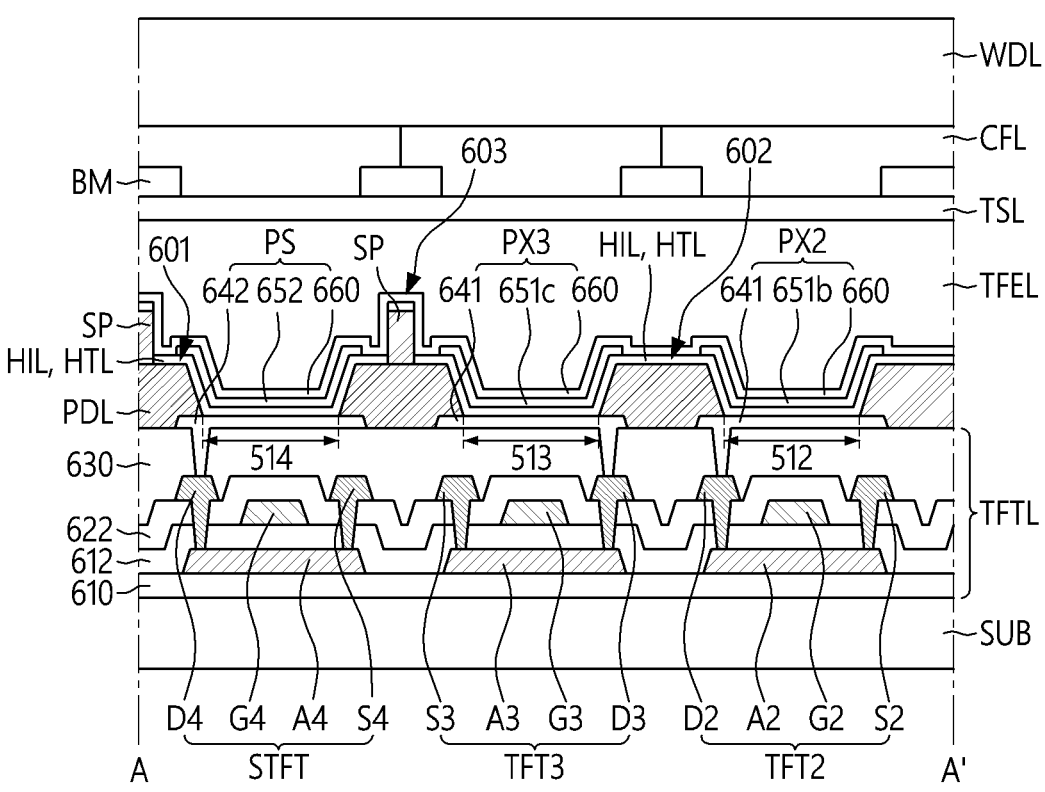
FIG. 6 is a cross-sectional view of a display panel taken along line A-A' of FIG. 5.

The light emitting element EL may be an organic light emitting diode including an organic light emitting layer disposed between an anode 641 (see FIG. 6) and a cathode 660 (see FIG. 6). Alternatively, the light emitting element EL may be a quantum dot light emitting element including a quantum dot light emitting layer disposed between the anode 641 and the cathode 660. Alternatively, the light emitting element EL may be an inorganic light emitting element including an inorganic semiconductor disposed between the anode 641 and the cathode 660. When the light emitting element EL is an inorganic light emitting element, it may include a micro-light emitting diode or a nano-light emitting diode.

The anode 641 of the light emitting element EL may be connected to a second electrode of a fifth transistor T5 and a first electrode of a sixth transistor T6, and the cathode 660 may be connected to a common voltage line VSL to which the common voltage ELVSS is applied.

A first transistor T1 is turned on by a $k^{th}$ scan signal of the $k^{th}$ scan line GWLk to connect the first electrode of the driving transistor DT to the $j^{th}$ data line DLj. Accordingly, a data voltage of the $j^{th}$ data line DLj may be applied to the first electrode of the driving transistor DT. The first transistor T1 may have the gate electrode connected to the $k^{th}$ scan line GWLk, the first electrode connected to the $j^{th}$ data line DLj, and the second electrode connected to the first electrode of the driving transistor DT.

A second transistor T2 is turned on by a $k^{th}$ scan control signal of the $k^{th}$ scan control line GCLk to connect the gate electrode and the second electrode of the driving transistor DT. When the gate electrode and the second electrode of the driving transistor DT are connected, the driving transistor DT operates as a diode. The second transistor T2 may have a gate electrode connected to the $k^{th}$ scan control line GCLk, a first electrode connected to the gate electrode of the driving transistor DT, and a second electrode connected to the second electrode of the driving transistor DT.

A third transistor T3 is turned on by a $k^{th}$ scan initialization signal of the $k^{th}$ scan initialization line GILk to connect the gate electrode of the driving transistor DT to a first initialization voltage line VIL1. Accordingly, a first initialization voltage VINT of the first initialization voltage line VIL1 may be applied to the gate electrode of the driving transistor DT. The third transistor T3 may have a gate electrode connected to the $k^{th}$ scan initialization line GILk, a first electrode connected to the first initialization voltage line VIL1, and a second electrode connected to the gate electrode of the driving transistor DT.

A fourth transistor T4 is turned on by a $k^{th}$ emission control signal of a $k^{th}$ emission control line EMLk to connect the first electrode of the driving transistor DT to a driving voltage line VDL to which the driving voltage ELVDD is applied. The fourth transistor T4 may have a gate electrode connected to the $k^{th}$ emission control line EMLk, a first electrode connected to the driving voltage line VDL, and a second electrode connected to the first electrode of the driving transistor DT.

The fifth transistor T5 is turned on by the $k^{th}$ emission control signal of the $k^{th}$ emission control line EMLk to connect the second electrode of the driving transistor DT to the anode 641 of the light emitting element EL. The fifth transistor T5 may have a gate electrode connected to the $k^{th}$ emission control line EMLk, a first electrode connected to the second electrode of the driving transistor DT, and the second electrode connected to the anode 641 of the light emitting element EL.

When both the fourth transistor T4 and the fifth transistor T5 are turned on, the driving current Isd of the driving transistor DT according to the voltage of the gate electrode of the driving transistor DT may flow to the light emitting element EL.

The sixth transistor T6 is turned on by a $(k-1)^{th}$ scan signal of the $(k-1)^{th}$ scan line GWLk-1 to connect the anode 641 of the light emitting element EL to a second initialization voltage line VIL2. A second initialization voltage VAINT of the second initialization voltage line VIL2 may be applied to the anode 641 of the light emitting element EL. The sixth transistor T6 may have a gate electrode connected to the $(k-1)^{th}$ scan line GWLk-1, the first electrode connected to the anode 641 of the light emitting element EL, and a second electrode connected to the second initialization voltage line VIL2.

The first capacitor Cst is connected between the gate electrode of the driving transistor DT and the driving voltage line VDL. A first capacitor electrode of the first capacitor Cst may be connected to the gate electrode of the driving transistor DT, and a second capacitor electrode may be connected to the driving voltage line VDL.

When the first electrode of each of the driving transistor DT and the first through sixth transistors T1 through T6 is a source electrode, the second electrode may be a drain electrode. Alternatively, when the first electrode of each of the driving transistor DT and the first through sixth transistors T1 through T6 is a drain electrode, the second electrode may be a source electrode.

An active layer of each of the driving transistor DT and the first through sixth transistors T1 through T6 may be made of any one of polysilicon, amorphous silicon, and an oxide semiconductor. For example, the active layer of each of the driving transistor DT, the first transistor T1, and the fourth through sixth transistors T4 through T6 may be made of polysilicon. The active layer of each of the second transistor T2 and the third transistor T3 may be made of an oxide semiconductor. In this case, the driving transistor DT, the first transistor T1, and the fourth through sixth transistors T4 through T6 may be formed as P-type metal oxide semiconductor field effect transistors (MOSFETs), and the second transistor T2 and the third transistor T3 may be formed as N-type MOSFETs.

Each of a plurality of sensor pixels PS may include a photoelectric converter PD, a plurality of sensing transistors, and various signal lines. The photoelectric converter PD includes light sensing portions for sensing external light. The sensing transistors may include first through third sensing transistors LT1 through LT3.

Each photoelectric converter PD may be a photodiode including a sensing anode 642 (see FIG. 6), the cathode 660, and a photoelectric conversion layer 652 disposed between the sensing anode 642 and the cathode 660. Each photoelectric converter PD may convert light incident from the outside into an electrical signal. The photoelectric converter PD may be a pn-type or pin-type inorganic photodiode or phototransistor made of an inorganic material. Alternatively, the photoelectric converter PD may be an organic photodiode including an electron donor material generating donor ions and an electron acceptor material generating acceptor ions.

When the photoelectric converter PD is exposed to external light, it may generate photocharges, and the generated photocharges may be accumulated in the sensing anode 642 of the photoelectric converter PD. In this case, the voltage of a first node N1 electrically connected to the sensing anode 642 may increase. When a current path is formed by the turn-on of the first and third sensing transistors LT1 and LT3, a sensing current may flow from the second initialization voltage line VIL2 to which the second initialization voltage VAINT is applied to a third node N3 disposed between the $q^{th}$ readout line ROLq and the third sensing transistor LT3 in proportion to the voltage of the first node N1 in which charges are accumulated.

The first sensing transistor LT1 may be turned on by the voltage of the first node N1 applied to a gate electrode thereof to connect the second initialization voltage line VIL2 to a second electrode of the third sensing transistor LT3. The first sensing transistor LT1 may have the gate electrode connected to the first node N1, a first electrode connected to the second initialization voltage line VIL2, and a second electrode connected to a first electrode of the third sensing transistor LT3. The first sensing transistor LT1 may be a source follower amplifier that generates a source-drain current in proportion to the amount of charge of the first node N1 which are connected to the gate electrode of the first sensing transistor LT1. Although the first electrode of the first sensing transistor LT1 is illustrated as being connected to the second initialization voltage line VIL2, the present disclosure is not limited thereto. The first electrode of the first sensing transistor LT1 may also be connected to the driving voltage line VDL or the first initialization voltage line VIII.

The second sensing transistor LT2 may be turned on by a $k^{th}$ reset control signal of the $k^{th}$ reset control line RSTLk to connect the first node N1 to a reset voltage line VRL to which a reset voltage Vrst is applied. The second sensing transistor LT2 may have a gate electrode connected to the $k^{th}$ reset control line RSTLk, a first electrode connected to the reset voltage line VRL, and a second electrode connected to the first node N1.

The third sensing transistor LT3 may be turned on by the $k^{th}$ scan signal of the $k^{th}$ scan line GWLk to connect the second electrode of the first sensing transistor LT1 to the $q^{th}$ readout line ROLq. The third sensing transistor LT3 may have a gate electrode connected to the $k^{th}$ scan line GWLk, the first electrode connected to the second electrode of the first sensing transistor LT1, and the second electrode connected to the third node N3 and the $q^{th}$ readout line ROLq.

An active layer of each of the first through third sensing transistors LT1 through LT3 may be made of any one of polysilicon, amorphous silicon, and an oxide semiconductor. For example, the active layers of the first sensing transistor LT1 and the third sensing transistor LT3 may be made of polysilicon. The active layer of the second sensing transistor LT2 may be made of an oxide semiconductor. In this case, the first sensing transistor LT1 and the third sensing transistor LT3 may be formed as P-type MOSFETs, and the second sensing transistor LT2 may be formed as an N-type MOSFET.

When the light emitting element EL emits light according to an emission current, a leakage current LL may be generated between the display pixel PX and the sensor pixel PS adjacent to the display pixel PX. The leakage current LL may be a part of the emission current generated when the light emitting element EL emits light. The leakage current LL may flow to the sensing anode 642 of the photoelectric converter PD through a hole injection layer HIL (see FIG. 6) and/or a hole transport layer HTL (see FIG. 6) disposed on the anode 641 of the light emitting element EL and the sensing anode 642 of the photoelectric converter PD. The leakage current LL may cause a decrease in the sensing accuracy of the sensor pixel PS.

The mobile electronic device 1 according to the embodiment includes a partition wall SP disposed around the sensor pixel PS to reduce the leakage current LL. The partition wall SP separates the hole injection layer HIL and the hole transport layer HTL, which are disposed on the anode 641 of the light emitting element EL and the sensing anode 642 of the photoelectric converter PD in a boundary area between the sensor pixel PS and the display pixel PX, thereby reducing the leakage current LL. The mobile electronic device 1 including the partition wall SP will now be described in more detail with reference to FIGS. 5 through 14.

Figure 5:
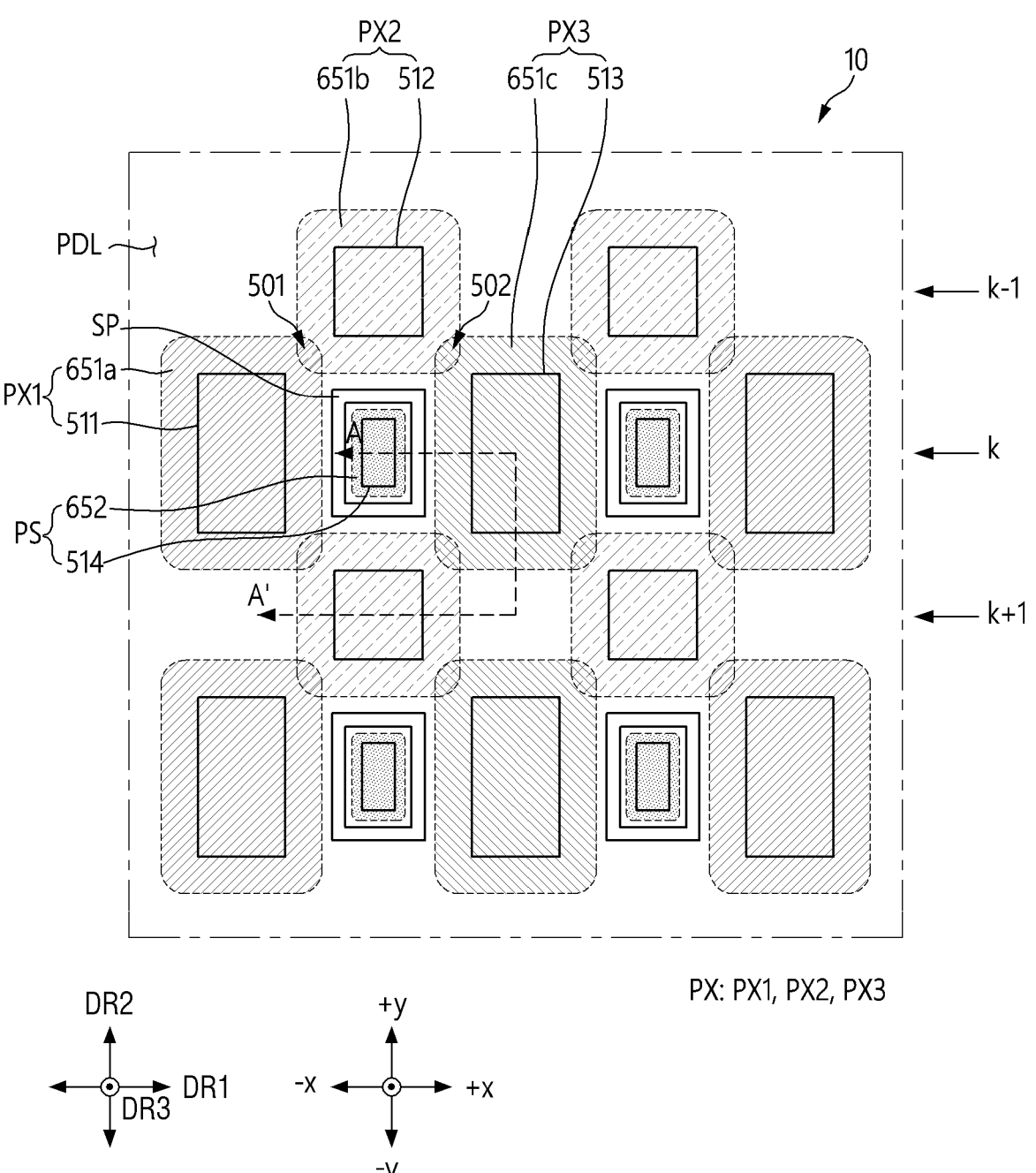
FIG. 5 is a plan view illustrating the arrangement relationship between pixels and photosensors according to an embodiment.

FIG. 5 is a plan layout view illustrating display pixels PX and sensor pixels PS of a display panel 10 according to an embodiment.

Referring to FIG. 5, a plurality of display pixels PX and a plurality of sensor pixels PS may be repeatedly disposed in the display panel 10 of the mobile electronic device 1.

The display pixels PX may be arranged in a matrix form. The display pixels PX may include first subpixels PX1, second subpixels PX2, and third subpixels PX3. For example, the first subpixels PX1 may emit light of a red wavelength, the second subpixels PX2 may emit light of a green wavelength, and the third subpixels PX3 may emit light of a blue wavelength.

The first subpixels PX1 and the third subpixels PX3 may be alternately arranged in each row along the first direction DR1. Each sensor pixel PS may be disposed between the first and second subpixels PX1 and PX3 adjacent to each other. Accordingly, in an arbitrary $k^{th}$ row, one of the first subpixel PX1 and the third subpixel PX3, and the sensor pixel PS may be alternately arranged along the first direction DR1. For example, a first subpixel PX1, a sensor pixel PS, a third pixel PX3, and a sensor pixel PX are arranged along the first direction DR1. Pixel groups each including the first subpixel PX1, the sensor pixel PS, the third pixel PX3, and the sensor pixel PX are repeatedly arranged along the first direction DR1.

The second subpixels PX2 may be arranged along the first direction DR1 in each of a $(k-1)^{th}$ row and a $(k+1)^{th}$ row adjacent to the $k^{th}$ row. For example, the second subpixels PX2 are arranged along the first direction DR1 in the $(k-1)^{th}$ row and the $(k+1)^{th}$ row. The second subpixels PX2 arranged along the first direction DR1 in the $(k-1)^{th}$ row and the $(k+1)^{th}$ row may be disposed in a direction diagonal (e.g., at 45 degrees or −45 degrees) to the direction in which the first subpixels PX1 are disposed in the $k^{th}$ row. Alternatively, the second subpixels PX2 may be disposed in a direction diagonal (e.g., at 45 degrees or −45 degrees) to the direction in which the third subpixels PX3 are disposed in the $k^{th}$ row. For example, a line connecting centers of the first subpixels PX1 and a line connecting a center of the first subpixel PX1 and a center of the second subpixel PX2 disposed adjacent each other may extend directions diagonal (e.g., at 45 degrees or −45 degrees) to each other in a plan view defined by the first direction DR1 and the second direction DR2 perpendicular to the first direction DR1. In addition, a line connecting centers of the third subpixels PX3 and a line connecting a center of the second subpixel PX2 and a center of the third subpixel PX3 disposed adjacent each other may extend directions diagonal (e.g., at 45 degrees or −45 degrees) to each other in a plan view defined by the first direction DR1 and the second direction DR2.

Each of the second subpixels PX2 may be disposed between sensor pixels PS adjacent to each other along the second direction DR2. That is, the second subpixels PX2 and the sensor pixels PS may be alternately arranged in each column along the second direction DR2.

The display panel 10 includes a pixel defining layer PDL which separates the display pixels PX and the sensor pixels PS. Areas of the display pixels PX and the sensor pixels PS are defined by open area in the pixel defining layer PDL.

Light emitting areas of the display pixels PX and light sensing areas of the sensor pixels PS may be disposed in the open areas in which the pixel defining layer PDL is removed. The open areas in which the pixel defining layer PDL is removed may correspond to the light emitting areas of the display pixels PX and the light sensing areas of the sensor pixels PS.

Each of the first subpixels PX1 includes a first light emitting layer 651a emitting red color, and the first light emitting layer 651a is disposed in a first open area 511 which is one of the open areas of the pixel defining layer PDL. The first light emitting layer 651a of each first subpixel PX1 may be disposed not only in the first open area 511 but also on a portion of the pixel defining layer PDL surrounding the first open area 511. In FIG. 5, an area indicated by a dotted line of each first subpixel PX1 is an area where the first light emitting layer 651a is disposed. In FIG. 5, an area indicated by a solid line inside the area indicated by the dotted line of each first subpixel PX1 is the first open area 511 corresponding to the first subpixel PX1 and is a first light emitting area of the first subpixel PX1.

Each of the second subpixels PX2 includes a second light emitting layer 651b emitting green color, and the second light emitting layer 651b is disposed in a second open area 512 which is one of the open areas of the pixel defining layer PDL. The second light emitting layer 651b of each second subpixel PX2 may be disposed not only in the second open area 512 but also on a portion of the pixel defining layer PDL surrounding the second open area 512. In FIG. 5, an area indicated by a dotted line of each second subpixel PX2 is an area where the second light emitting layer 651b is disposed. In FIG. 5, an area indicated by a solid line inside the area indicated by the dotted line of each second subpixel PX2 is the second open area 512 corresponding to the second subpixel PX2 and is a second light emitting area of the second subpixel PX2.

Each of the third subpixels PX3 includes a third light emitting layer 651c emitting blue color, and the third light emitting layer 651c is disposed in a third open area 513 which is one of the open areas of the pixel defining layer PDL. The third light emitting layer 651c of each of the third subpixels PX3 may be disposed not only in the third open area 513 but also on a portion of the pixel defining layer PDL surrounding the third open area 513. In FIG. 5, an area indicated by a dotted line of each third subpixel PX3 is an area where the third light emitting layer 651c is disposed. In FIG. 5, an area indicated by a solid line inside the area indicated by the dotted line of each third subpixel PX3 is the third open area 513 corresponding to the third subpixel PX3 and is a third light emitting area of the third subpixel PX3.

As indicated by an arrow 501 in FIG. 5, a portion of the second light emitting layer 651b of each second subpixel PX2 may overlap the first light emitting layer 651a of a first subpixel PX1 which neighbors the second subpixel PX2 on the pixel defining layer PDL. As indicated by an arrow 502 in FIG. 5, a portion of the second light emitting layer 651b of each second subpixel PX2 may overlap the third light emitting layer 651c of a third subpixel PX3 which neighbors the second subpixel PX2 on the pixel defining layer PDL.

Each of the sensor pixels PS includes a photoelectric conversion layer 652, and the photoelectric conversion layer 652 is disposed in a fourth open area 514 which is one of the open areas of the pixel defining layer PDL. The photoelectric conversion layer 652 of each sensor pixel PS may be disposed not only in the fourth open area 514 but also on a portion of the pixel defining layer PDL surrounding the fourth open area 514. In FIG. 5, an area indicated by a dotted line of each sensor pixel PS is an area where the photoelectric conversion layer 652 is disposed. In FIG. 5, an area indicated by a solid line inside the area indicated by the dotted line of each sensor pixel PS is the fourth open area 514 corresponding to the sensor pixel PS and is a light sensing area of the sensor pixel PS.

A partition wall SP may completely surround the photoelectric conversion layer 652 of each sensor pixel PS in a plan view. The partition wall SP may be a structure disposed on the pixel defining layer PDL to completely surround each sensor pixel PS in a plan view. The partition wall SP may be disposed between each sensor pixel PS and the first through third subpixels PX1 through PX3 around the sensor pixel PS.

A portion of the photoelectric conversion layer 652 and a portion of the first light emitting layer 651a of each first subpixel PX1 are disposed on the pixel defining layer PDL but may be spaced apart from each other in an area corresponding to the partition wall SP between them without overlapping each other. In addition, a portion of the photoelectric conversion layer 652 and a portion of the second light emitting layer 651b of each second subpixel PX2 are disposed on the pixel defining layer PDL but may be spaced apart from each other in an area corresponding to the partition wall SP between them without overlapping each other. In addition, a portion of the photoelectric conversion layer 652 and a portion of the third light emitting layer 651c of each third subpixel PX3 are disposed on the pixel defining layer PDL but may be spaced apart from each other in an area corresponding to the partition wall SP disposed between them without overlapping each other.

In the above description, the first open area 511, the second open area 512, the third open area 513, and the fourth open area 514 may be areas of the pixel defining layer PDL from which the pixel defining layer PDL are removed.

The sensor pixels PS detect a user's biometric information using at least one of red light emitted from the first subpixels PX1, green light emitted from the second subpixels PX2, and blue light emitted from the third subpixels PX3. The biometric information includes fingerprint information, iris information, blood pressure information, and blood flow information.

The arrangement of the sensor pixels PS and the display pixels illustrated in FIG. 5 is only an example, and the present disclosure is not limited thereto.

FIG. 6 is a cross-sectional view of the display panel 10 taken along line A-A' of FIG. 5.

Referring to FIG. 6, the display panel 10 according to the embodiment may include a substrate SUB, a thin-film transistor layer TFTL disposed on the substrate SUB, a light emitting element layer (e.g., an OLED layer) including the anodes 641, the light emitting layers 651a through 651c, and the cathodes 660 disposed on the thin-film transistor layer TFTL, an encapsulation layer TFEL disposed on the light emitting element layer, a touch sensor layer TSL including touch electrodes (not illustrated) disposed on the encapsulation layer TFEL, a color filter layer CFL disposed on the touch sensor layer TSL, and a window WDL disposed on the color filter layer CFL. The photoelectric converter PD disposed to correspond to a sensor pixel PS may be disposed in a same plane as the light emitting element layer. Each of the photoelectric converter PD may include a sensor anodes 642, a photoelectric conversion layer 652, and a cathode 660. The color filter layer CFL may include a color filter (not illustrated), and the color filter may be configured to transmit a color of a predetermined wavelength. The color filter layer CFL may further include a black matrix BM.

The cross-sectional structure of the display panel 10 according to the embodiment will now be described in more detail.

A buffer layer 610 is disposed on the substrate SUB. The buffer layer 610 may include silicon nitride, silicon oxide, or silicon oxynitride.

Thin-film transistors of the thin-film transistor layer TFTL may be disposed on the buffer layer 610. For example, the thin-film transistor layer TFTL may include at least one first thin-film transistor TFT1 (see FIG. 8) for driving a first subpixel PX1, at least one second thin-film transistor TFT2 for driving a second subpixel PX2, at least one third thin-film transistor TFT3 for driving a third subpixel PX3, and at least one sensing thin-film transistor STFT for driving the photoelectric converter PD of the sensor pixel PS.

Respective semiconductor layers A1 through A4 of the thin-film transistors TFT1 through TFT3 and STFT may be disposed on the buffer layer 610. The semiconductor layers A1 through A4 may include polycrystalline silicon. In an embodiment, the semiconductor layers A1 through A4 may include monocrystalline silicon, low-temperature polycrystalline silicon, amorphous silicon, or an oxide semiconductor. The oxide semiconductor may include, for example, a binary compound (ABx), a ternary compound (ABxCy) or a quaternary compound (ABxCyDz) containing indium, zinc, gallium, tin, titanium, aluminum, hafnium (Hf), zirconium (Zr), magnesium (Mg), etc. Each of the semiconductor layers A1 through A4 may include a channel region and a source region and a drain region doped with impurities.

A gate insulating layer 612 may be disposed on the semiconductor layers A1 through A4 of the thin-film transistors TFT1 through TFT3 and the sensing thin-film transistor STFT. The gate insulating layer 612 electrically insulates the semiconductor layers A1 through A4 from gate electrodes G1 through G4 of the thin-film transistors TFT1 through TFT3 and the sensing thin-film transistor STFT, respectively. The gate insulating layer 612 may be made of an insulating material such as silicon oxide (SiOx), silicon nitride (SiNx), or metal oxide.

The respective gate electrodes G1 through G4 of the thin-film transistors TFT1 through TFT3 and the sensing thin-film transistor STFT are disposed on the gate insulating layer 612.

An interlayer insulating layer 622 may be disposed on the gate electrodes G1 through G4. The interlayer insulating layer 622 may include an inorganic insulating material such as silicon oxide (SiOx), silicon nitride (SiNx), silicon oxynitride, hafnium oxide, or aluminum oxide.

Respective source electrodes S1 through S4 and drain electrodes D1 through D4 of the thin-film transistors TFT1 through TFT3 and the sensing thin-film transistor STFT are disposed on the interlayer insulating layer 622. The source electrodes S1 through S4 may be respectively electrically connected to the source regions of the semiconductor layers A1 through A4 of the thin-film transistors TFT1 through TFT3 and the sensing thin-film transistor STFT through contact holes formed through the interlayer insulating layer 622 and the gate insulating layer 612. The drain electrodes D1 through D4 may be respectively electrically connected to the drain regions of the semiconductor layers A1 through A4 of the thin-film transistors TFT1 through TFT3 and the sensing thin-film transistor STFT through contact holes formed through the interlayer insulating layer 622 and the gate insulating layer 612.

The source electrodes S1 through S4 and the drain electrodes D1 through D4 may include one or more metals selected from a group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A planarization layer 630 is disposed on the interlayer insulating layer 622 and the source electrodes S1 through S4 and the drain electrodes D1 through D4. The planarization layer 630 may be made of an organic insulating material or the like. The planarization layer 630 may have a flat surface and may include a contact hole exposing any one of the source electrode S1, S2, S3 or S4 and the drain electrode D1, D2, D3 or D4 of each thin-film transistor.

The light emitting element layer (e.g., the OLED layer) including the light emitting layers 651a through 651c may be disposed on the planarization layer 630. The light emitting element layer may include the light emitting layers 651a through 651c disposed to respectively correspond to the display pixels PX and the photoelectric conversion layer 652 disposed to correspond to each sensor pixel PS. Specifically, an anode 641 (e.g., a pixel electrode) of each of the first through third subpixels PX1 through PX3 and a sensing anode 642 of each sensor pixel PS are disposed on the planarization layer 630.

The anode 641 may have a single layer structure of molybdenum (Mo), titanium (Ti), copper (Cu) or aluminum (Al) or a laminated layer structure, for example, a multilayer structure of ITO/Mg, ITO/MgF, ITO/Ag or ITO/Ag/ITO including indium tin oxide (ITO), indium zinc oxide (IZO), zinc oxide (ZnO) or indium oxide ($In_2O_3$) and silver (Ag), magnesium (Mg), aluminum (Al), platinum (Pt), lead (Pd), gold (Au) or nickel (Ni). The anode 641 may be electrically connected to each of the thin-film transistors TFT1 through TFT3 through a contact hole formed through a portion of the planarization layer 630.

The sensing anode 642 may have a single layer structure of molybdenum (Mo), titanium (Ti), copper (Cu) or aluminum (Al) or a multilayer structure of ITO/Mg, ITO/MgF, ITO/Ag or ITO/Ag/ITO. The sensing anode 642 may be electrically connected to each sensing thin-film transistor STFT through a contact hole formed through a portion of the planarization layer 630.

The pixel defining layer PDL may be disposed on the planarization layer 630 on the anodes 641 and the sensing anodes 642 and may be formed to separate the anodes 641 and the sensing anodes 642. The pixel defining layer PDL may be referred to as a "bank". The pixel defining layer PDL may cover edges of each of the anodes 641. In addition, the pixel defining layer PDL may cover edges of each of the sensing anodes 642.

A portion of the pixel defining layer PDL corresponding to the first subpixel PX1 is removed to form the first open area 511. The anode 641 of the first subpixel PX1 is not covered by the pixel defining layer PDL and may be exposed by the first open area 511 during a manufacturing process for forming the pixel defining layer PDL. The first open area 511 substantially forms a light emitting area of the first subpixel PX1.

A portion of the pixel defining layer PDL corresponding to the second subpixel PX2 is removed to form the second open area 512. The anode 641 of the second subpixel PX2 is not covered by the pixel defining layer PDL and may be exposed by the second open area 512 during a manufacturing process for forming the pixel defining layer PDL. The second open area 512 substantially forms a light emitting area of the second subpixel PX2.

A portion of the pixel defining layer PDL corresponding to the third subpixel PX3 is removed to form the third open area 513. The anode 641 of the third subpixel PX3 is not covered by the pixel defining layer PDL and may be exposed by the third open area 513 during a manufacturing process for forming the pixel defining layer PDL. The third open area 513 substantially forms a light emitting area of the third subpixel PX3.

A portion of the pixel defining layer PDL corresponding to the sensor pixel PS is removed to form the fourth open area 514. The sensing anode 642 of the sensor pixel PS is not covered by the pixel defining layer PDL and may be exposed by the fourth open area 514 during a manufacturing process for forming the pixel defining layer PDL. The fourth open area 514 substantially forms a light sensing area of the sensor pixel PS.

The pixel defining layer PDL may be made of an organic layer such as acryl resin, epoxy resin, phenolic resin, polyamide resin, or polyimide resin.

A partition wall SP is disposed on the pixel defining layer PDL to surround the sensor pixel PS. The partition wall SP may be disposed on the pixel defining layer PDL to completely surround the sensor pixel PS and may be formed to have a predetermined height. The partition wall SP may be disposed only in an area around the sensor pixel PS. For example, the sensor pixel PS may be disposed only in a part (e.g., a fingerprint sensing area) of the active area AAR. In this case, the partition wall SP may be disposed only in this part (e.g., the fingerprint sensing area). The partition wall SP may be made of an organic layer such as acryl resin, epoxy resin, phenolic resin, polyamide resin, or polyimide resin.

The hole injection layer HIL and the hole transport layer HTL are sequentially disposed on the anodes 641, the sensing anode 642, and the pixel defining layer PDL. The hole injection layer HIL and the hole transport layer HTL are commonly disposed in the first through third subpixels PX1 through PX3 and the sensor pixel PS. However, in a boundary area of the sensor pixel PS, the hole injection layer HIL and the hole transport layer HTL may be disconnected during a deposition process due to a poor step coverage of materials for forming the hole injection layer HIL and the hole transport layer HTL. When the partition wall SP has a height enough to cause disconnection of the materials for forming the hole injection layer HIL and the hole transport layer HTL, the hole injection layer HIL and the hole transport layer HTL may be disconnected on the side of the partition wall SP. That is, the hole injection layers HIL and the hole transport layers HTL of neighboring subpixels are connected to each other on the pixel defining layer PDL between the neighboring subpixels. On the other hand, the hole injection layer HIL and the hole transport layer HTL corresponding to the sensor pixel PS may have an island shape and may be separated by the partition wall SP. Thus, they may not be connected to the hole injection layers HIL and the hole transport layers HTL disposed in adjacent subpixels. This discontinuous structure of the hole injection layer HIL and the hole transport layer HTL corresponding to the sensor pixel PS may block or reduce the leakage current LL through the hole injection layer HIL and the hole transport layer HTL. In FIG. 6, an arrow 601 indicates a state in which the hole injection layer HIL and the hole transport layer HTL are separated by the partition wall SP in the boundary area of the sensor pixel PS. In FIG. 6, an arrow 602 indicates a state in which the hole injection layers HIL and the hole transport layers HTL of neighboring subpixels PX2 and PX3 are connected to each other on the pixel defining layer PDL on which the partition wall SP is not disposed between the neighboring subpixels PX2 and PX3.

The light emitting layers 651a through 651c of the first through third subpixels PX1 through PX3 and the photoelectric conversion layer 652 corresponding to each sensor pixel PS are disposed on the hole injection layer HIL and the hole transport layer HTL. The first light emitting layer 651a of the first subpixel PX1 may be configured to emit red light. The second light emitting layer 651b of the second subpixel PX2 may be configured to emit green light. The third light emitting layer 651c of the third subpixel PX3 may be configured to emit blue light. Light emitted from the light emitting layers 651a through 651c may contribute to image display or function as a light source incident on the sensor pixel PS. The photoelectric conversion layer 652 may be configured to generate photocharges in proportion to the intensity of light incident from the outside.

The photoelectric conversion layer 652 may include an electron donor material and an electron acceptor material. The electron donor material may generate donor ions in response to light, and the electron acceptor material may generate acceptor ions in response to light. The photoelectric conversion layer 652 may be made of an organic material or an inorganic material. When the photoelectric conversion layer 652 is made of an organic material, the electron donor material may include, but not limited to, a compound such as subphthalocyanine (SubPc) or dibutylphosphate (DBP). The electron acceptor material may include, but not limited to, a compound such as fullerene, a fullerene derivative, or perylene diimide. When the photoelectric conversion layer 652 is made of an inorganic material, it may be a pn-type or pin-type phototransistor. For example, the photoelectric conversion layer 652 may have a structure in which an N-type semiconductor layer, an I-type semiconductor layer, and a P-type semiconductor layer are sequentially stacked.

An electron injection layer (not illustrated) and an electron transport layer (not illustrated) may be disposed on the light emitting layers 651a through 651c and the photoelectric conversion layer 652. The cathode 660 may be disposed on the electron injection layer and the electron transport layer. The cathode 660 may be a common electrode commonly disposed on the first through third subpixels PX1 through PX3 and the sensor pixel PS. In particular, since a material forming the cathode 660 has better step coverage characteristics than the hole injection layer HIL and the hole transport layer HTL, even if the partition wall SP is disposed in the boundary area of the sensor pixel PS, the cathode 660 is not disconnected during a deposition process. Therefore, the cathodes 660 of neighboring subpixels may be connected to each other on the pixel defining layer PDL between the neighboring subpixels. In addition, the cathode 660 corresponding to the sensor pixel PS may be connected to the cathodes 660 of adjacent subpixels on the pixel defining layer PDL on the partition wall SP. In FIG. 6, an arrow 603 indicates a state in which the cathode 660 corresponding to the sensor pixel PS is connected to the cathodes 660 of adjacent subpixels PX2 and PX3 on the pixel defining layer PDL and on the partition wall SP.

The encapsulation layer TFEL may be disposed on the cathode 660. The encapsulation layer TFEL includes at least one inorganic layer to prevent penetration of oxygen or moisture. In addition, the encapsulation layer TFEL includes at least one organic layer to protect the light emitting element layer (e.g., the OLED layer) from foreign substances such as dust.

As described above, the touch sensor layer TSL including touch electrodes (not illustrated), the color filter layer CFL disposed on the touch sensor layer TSL, and the window WDL disposed on the color filter layer CFL may be disposed on the encapsulation layer TFEL.

Figure 7:
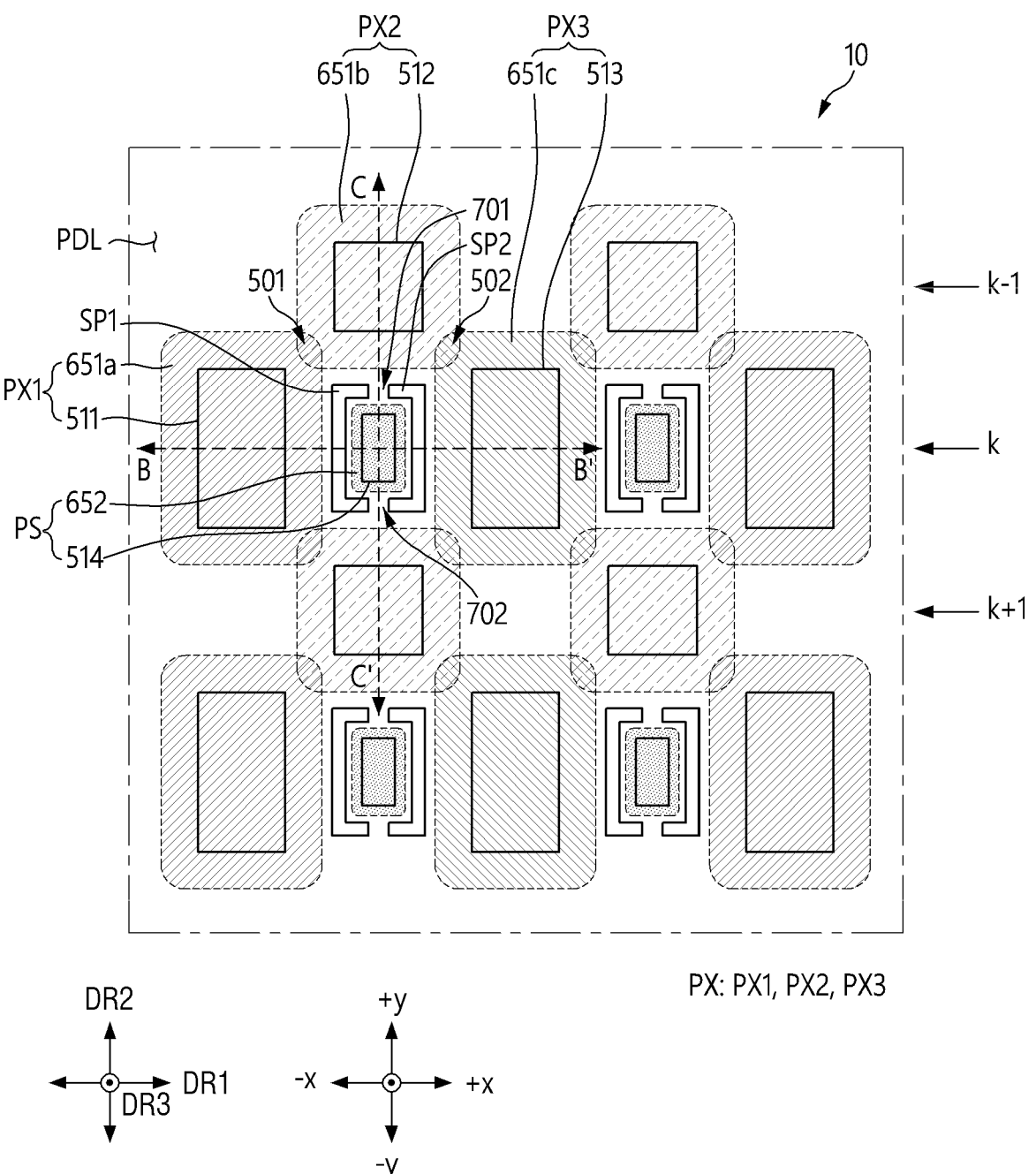
FIG. 7 is a plan view of a display panel in which each partition wall includes at least one slit according to an embodiment.
Figure 8:
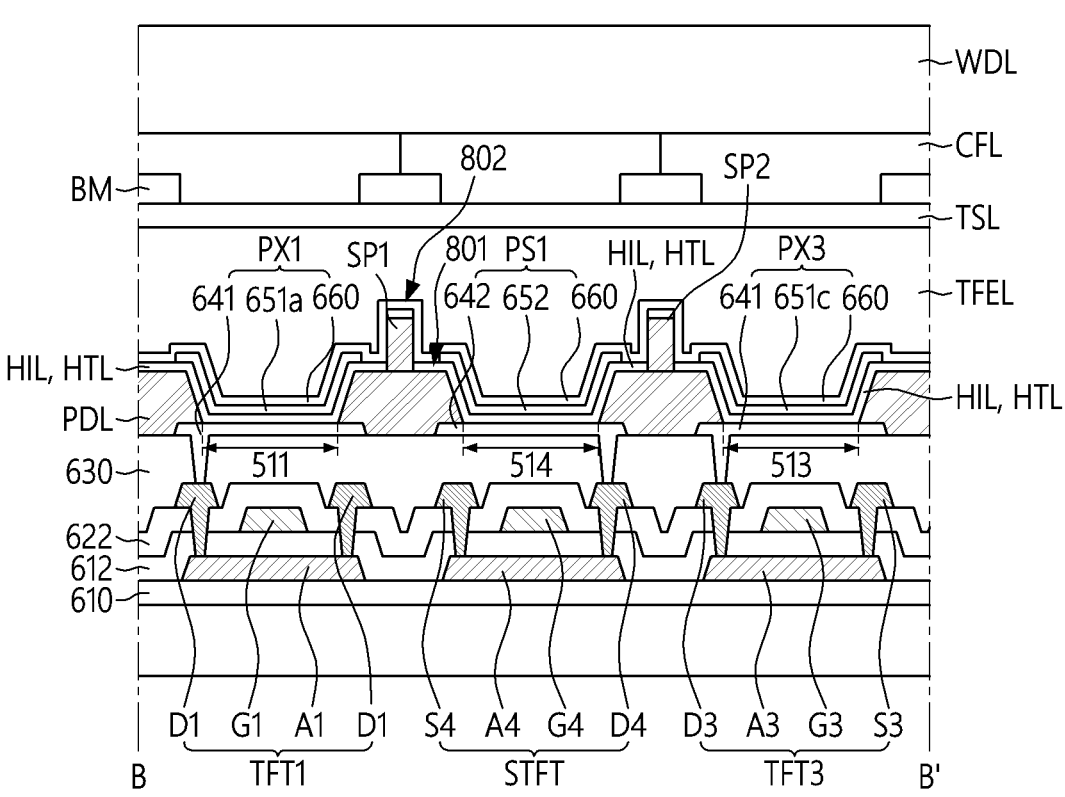
FIG. 8 is a cross-sectional view of the display panel taken along line B-B' of FIG. 7.
Figure 9:
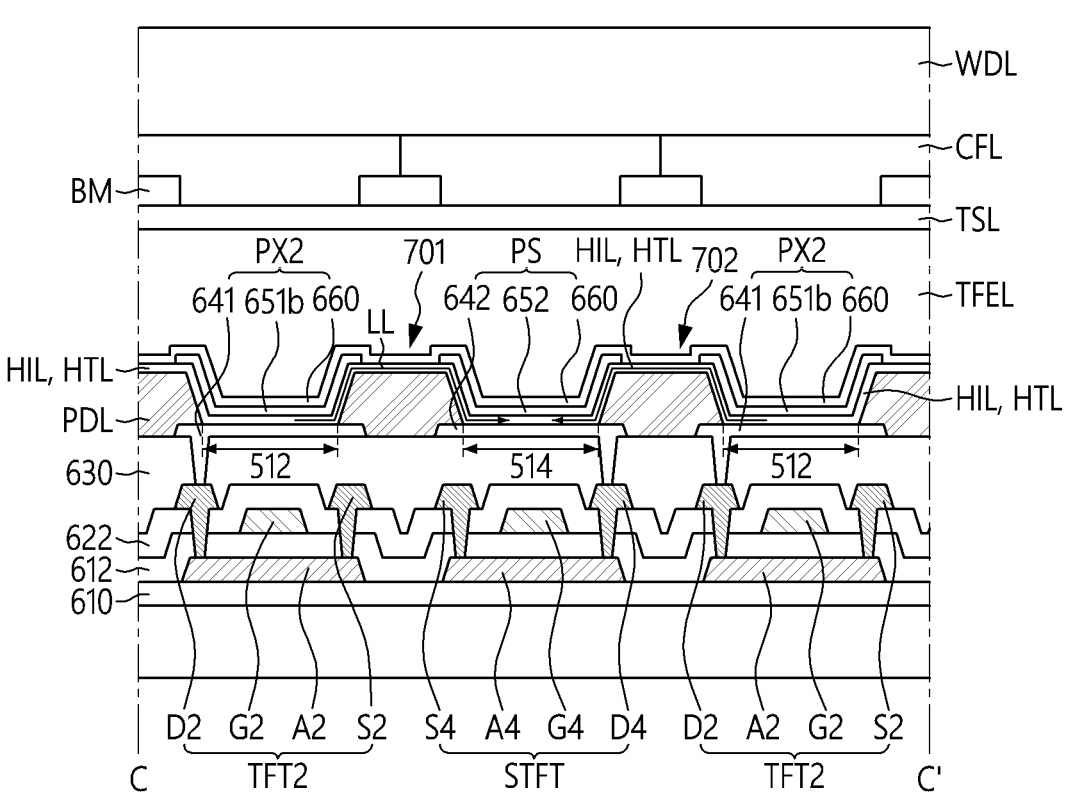
FIG. 9 is a cross-sectional view of the display panel taken along line C-C' of FIG. 7.

FIG. 7 is a plan view of a display panel 10 in which each partition wall SP includes at least one slit area according to an embodiment. FIG. 8 is a cross-sectional view of the display panel 10 taken along line B-B' of FIG. 7. FIG. 9 is a cross-sectional view of the display panel 10 taken along line C-C' of FIG. 7.

The embodiment of FIGS. 7 through 9 may be similar to the embodiment of FIGS. 5 and 6. The following description will focus only on differences of the embodiment of FIGS. 7 through 9 from the embodiment of FIGS. 5 and 6. Therefore, a description of features not described in FIGS. 7 through 9 will be replaced with the description of the embodiment of FIGS. 5 and 6.

The embodiment of FIGS. 7 through 9 is different from the embodiment of FIGS. 5 and 6 in that a partition wall SP1 and SP2 surrounding each sensor pixel PS includes slit structures 701 and 702. The slit structures 701 and 702 refer to structures in which the partition wall SP1 and SP2 has a lower height than in other areas or is completely removed. For example, in the embodiment of FIGS. 5 and 6, each partition wall SP has a uniform height. On the other hand, in the embodiment of FIGS. 7 through 9, the partition wall may have a portion that has a lower height or in which the partition wall is completely removed in an area between the partition walls, between the SP1 and the SP2.

According to an embodiment, a plurality of sensor pixels PS detect a user's biometric information using at least one of red light emitted from first subpixels PX1, green light emitted from second subpixels PX2, and blue light emitted from third subpixels PX3. The biometric information includes fingerprint information, iris information, blood pressure information, and blood flow information. For example, the sensor pixels PS may include first sensor pixels PS1 configured to detect blood pressure information and/or blood flow information. The first sensor pixels PS1 may detect blood pressure information and/or blood flow information using red light emitted from the first subpixels PX1 or blue light emitted from the third subpixels PX3.

FIG. 7 illustrates, as an example of the sensor pixels PS, the first sensor pixels PS1 that detect blood pressure information and/or blood flow information using red light emitted from the first subpixels PX1 or blue light emitted from the third subpixels PX3.

Referring to FIG. 7, a third subpixel PX3 emitting blue light is disposed in a +x direction of each first sensor pixel PS1. A first subpixel PX1 emitting red light is disposed in a −x direction of each first sensor pixel PS1. A second subpixel PX2 emitting green light is disposed in a +y direction of each first sensor pixel PS1. In addition, a second subpixel PX2 emitting green light is disposed in a −y direction of each first sensor pixel PS1. Here, the +x direction is the first direction DR1 and the −x direction is an opposite direction to the +x direction. In addition, the +y direction is the second direction DR2 and the −y direction is an opposite direction to the +y direction.

According to an embodiment, a partition wall SP is disposed between each first sensor pixel PS1 and the first subpixel PX1, the second subpixels PX2, and the third subpixel PX3 to surround the first sensor pixel PS1. However, the partition wall SP may include the slit structures 701 and 702. The slit structures 701 and 702 of the partition wall SP are disposed in the +y direction and the −y direction from each first sensor pixel PS1, respectively, in areas disposed between the each first sensor pixel PS1 and two second subpixels PX2 disposed adjacent to the each first sensor pixel PS1. The slit structures 701 and 702 of the partition wall SP may have a width enough to minimize a leakage current LL between the first sensor pixels PS1 and subpixels PX2 disposed adjacent to the sensor pixels when a first subpixel PX1 emits red light or a third subpixel PX3 emits blue light.

For example, each of the partition wall SP surrounding each first sensor pixel PS1 may be shaped like square brackets "[" or "]". That is, the partition wall SP surrounding each first sensor pixel PS1 may include a first partition wall portion SP1 disposed between the first sensor pixel PS1 and a first subpixel PX1 located in the −x direction from the first sensor pixel PS1 and a second partition wall portion SP2 disposed between the first sensor pixel PS1 and a third subpixel PX3 located in the +x direction from the first sensor pixel PS1. The first partition wall portion SP1 may be shaped like a square bracket "[", and the second partition wall portion SP2 may be shaped like a square bracket "]".

The first partition wall portion SP1 and the second partition wall portion SP2 may be spaced apart from each other by a predetermined gap and may be disposed symmetrically to each other. The gap between the first partition wall portion SP1 and the second partition wall portion SP2 forms the slit structures 701 and 702. The slit structures 701 and 702 may be aligned with centers of the second subpixels PX2 emitting green light. In FIG. 7, an arrow 701 indicates a first slit 701 of a partition wall SP1 and SP2 disposed in a portion between a first sensor pixel PS1 and a second subpixel PX2 disposed in a (k-1)$^{th}$ row. In FIG. 7, an arow 702 indicates a second slit 702 of the partition wall SP1 and SP2 disposed in a portion between the first sensor pixel PS1 and a second subpixel PX2 disposed in a (k+1)$^{th}$ row.

Referring to an arrow 801 in FIG. 8, in a boundary area of a first sensor pixel PS1, a hole injection layer HIL and a hole transport layer HTL are disconnected in a region corresponding to side surfaces of the first partition wall portion SP1 located between the first sensor pixel PS1 and a first subpixel PX1 due to the first partition wall portion SP1 having a height enough to disconnect the hole injection layer HIL and the hole transport layer HTL. Similarly, the hole injection layer HIL and the hole transport layer HTL are disconnected on side surfaces of the second partition wall portion SP2 located between the first sensor pixel PS1 and a third subpixel PX3.

On the other hand, referring to an arrow 802 in FIG. 8, a cathode 660 corresponding to the first sensor pixel PS1 is connected to a cathode 660 of the first subpixel PX1 on a pixel defining layer PDL on the first partition wall SP1. This is because the cathode 660 has better step coverage characteristics than the hole injection layer HIL and hole transport layer HTL.

Referring to FIGS. 7 and 9, the slit structures 701 and 702 of each partition wall SP1 and SP2 are aligned with a second subpixel PX2 disposed in the (k-1)$^{th}$ row and a second subpixel PX2 disposed in the (k+1)$^{th}$ row. As illustrated in FIG. 9, each partition wall SP may have a smaller height in the first slit 701 and the second slit 702 than in the other area (e.g., an area of the partition wall excluding the first slit 701 and the second slit 702). Alternatively, in the first slit 701 and the second slit 702, each partition wall SP1 and SP2 may be completely removed not to have a height.

Since the height of each partition wall SP1 and SP2 is reduced in the first slit 701 and the second slit 702, the hole injection layer HIL and the hole transport layer HTL may be formed continuously on the pixel defining layer PDL without being separated. Therefore, a leakage current LL may be generated through the hole injection layer HIL and/or the hole transport layer HTL in the first slit 701 and the second slit 702. However, since the path of the leakage current LL is limited to the first slit 701 and the second slit 702, and a length of the path of the leakage current increases, the influence of the leakage current LL may be minimized. That is, the leakage current LL is generated between a first subpixel PX1 and/or a third subpixel PX3 and a first sensor pixel PS1 when the first subpixel PX1 emits red light or when the third subpixel PX3 emits blue light. However, since the leakage current LL path is limited to the first slit 701 and the second slit 702 facing the second subpixels PX2, its influence is reduced.

The partition walls SP may not include a slit structure as illustrated in FIG. 5. For example, the sensor pixels PS may include second sensor pixels configured to detect fingerprint information. The second sensor pixels may detect blood pressure information and/or blood flow information using green light emitted from the second subpixels PX2. In this case, the partition wall SP surrounding each second subpixel PX2 may have a generally constant height. For example, the sensor pixels PS illustrated in FIGS. 5 and 6 may be second sensor pixels using green light, and the partition wall SP surrounding each second sensor pixel may have a generally constant height.

According to an embodiment, in the display panel 10 including the partition walls SP, the area of each sensor pixel PS and the area of a light sensing area of each sensor pixel PS may be increased. For example, the display panel 10 may include the partition wall SP surrounding each sensor pixel PS to reduce the leakage current LL. Therefore, in the display panel 10, the area of the light sensing area (e.g., a fourth open area 514) corresponding to each sensor pixel PS may be increased, thereby improving sensing performance. The structures of the display panel 10 in which the area of each sensor pixel PS is increased will now be described with reference to FIGS. 10 through 14.

Figure 10:
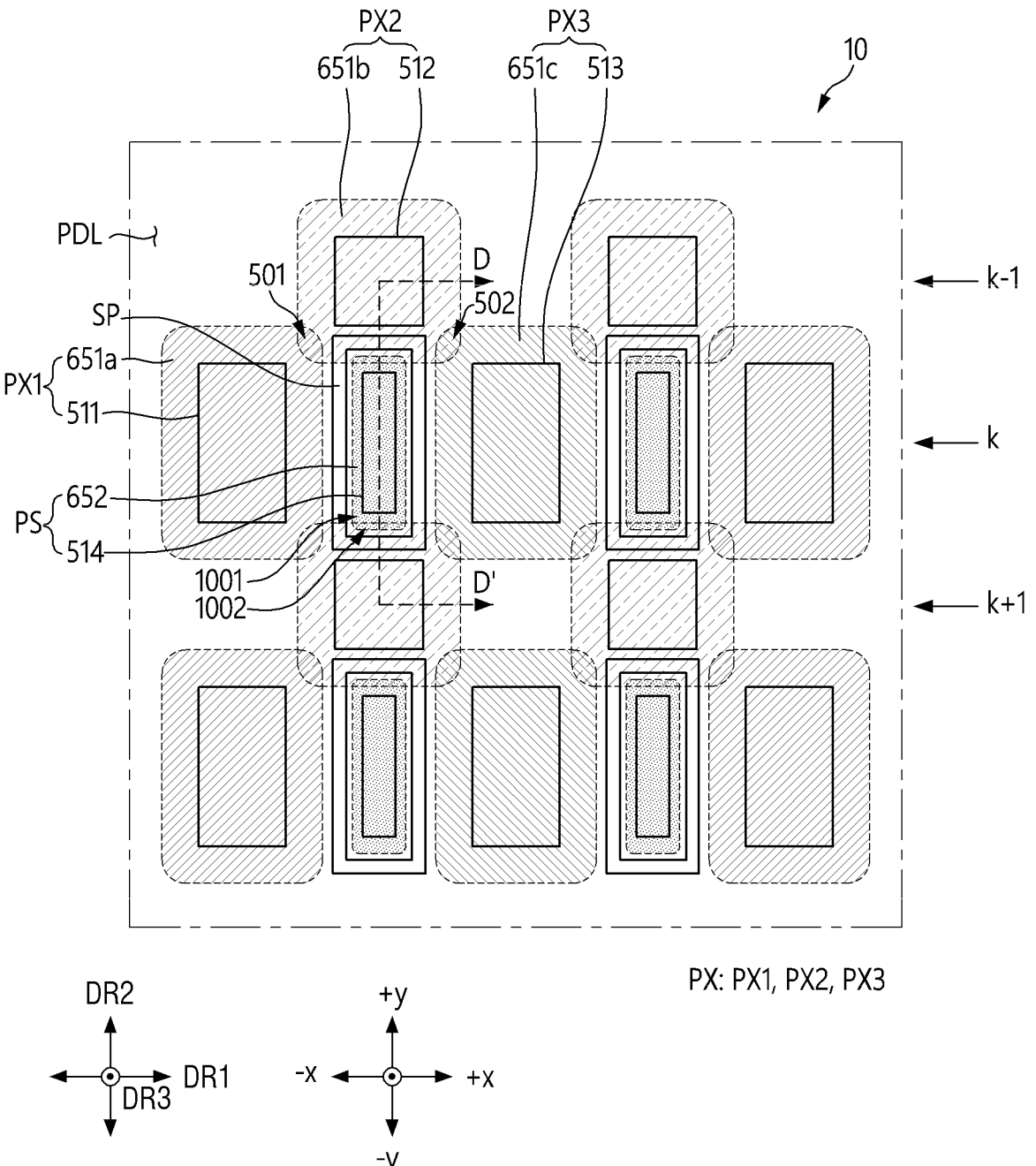
FIG. 10 is a plan view of a display panel in which at least a portion of each photosensor overlaps pixels according to an embodiment.
Figure 11:
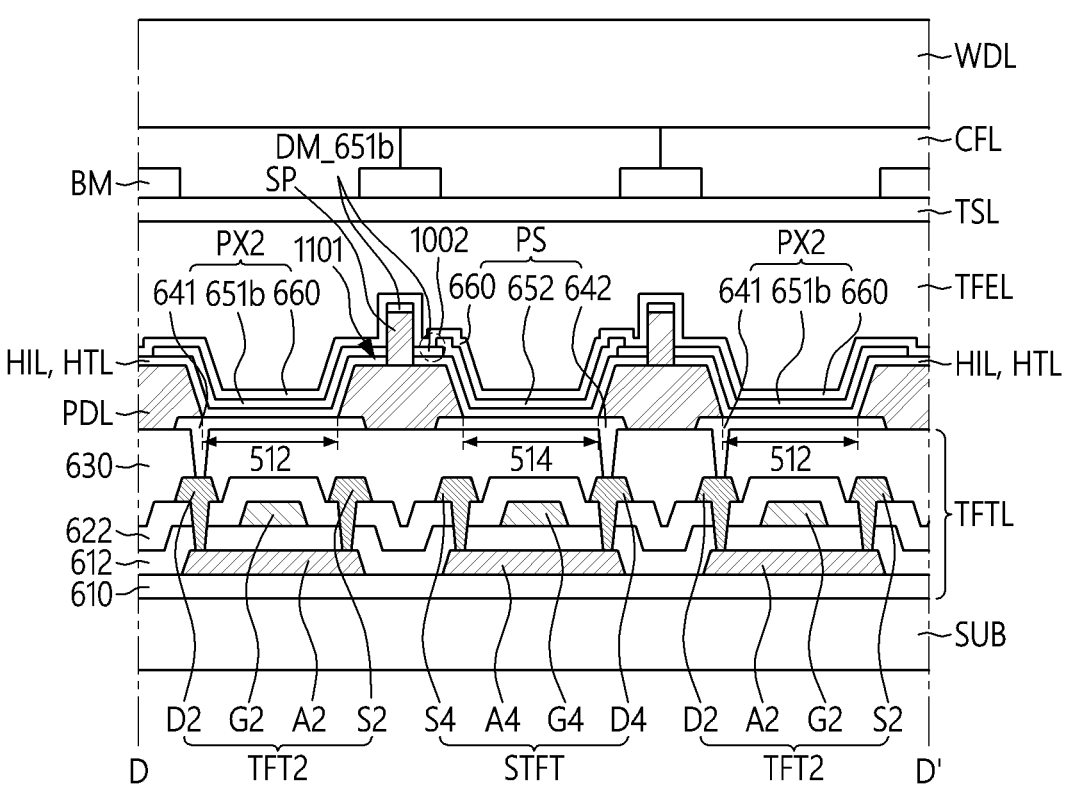
FIG. 11 is a cross-sectional view of the display panel taken along line D-D' of FIG. 10.

FIG. 10 is a plan view of a display panel in which at least a portion of each photosensor overlaps pixels according to an embodiment. FIG. 11 is a cross-sectional view of the display panel taken along line D-D' of FIG. 10.

The embodiment of FIGS. 10 and 11 may be similar to the embodiment of FIGS. 5 and 6. The following description will focus only on differences of the embodiment of FIGS. and 11 from the embodiment of FIGS. 5 and 6. Therefore, a description of features not described in FIGS. 10 and 11 will be replaced with the description of the embodiment of FIGS. 5 and 6.

The embodiment of FIGS. 10 and 11 is different from the embodiment of FIGS. 5 and 6 in that the area of a fourth open area 514 corresponding to a light sensing area of each sensor pixel PS increases and that at least a portion of a photoelectric conversion layer 652 of each sensor pixel PS overlaps portions of second light emitting layers 651b of second subpixels PX2.

Referring to FIGS. 10 and 11, at least a portion of the photoelectric conversion layer 652 of each sensor pixel PS overlaps portions of the second light emitting layers 651b of the second subpixels PX2. For example, the photoelectric conversion layer 652 of each sensor pixel PS includes a green overlap area 1002 overlapping portions of the second light emitting layers 651b of the second subpixels PX2 and a non-overlap area 1001 other than the green overlap area 1002. The green overlap area 1002 may overlap a portion of the second light emitting layer 651b of a second subpixel PX2 in a $(k-1)^{th}$ row located in the +y direction from each sensor pixel PS. In addition, the green overlap area 1002 may overlap a portion of the second light emitting layer 651b of a second subpixel PX2 in a $(k+1)^{th}$ row located in the −y direction from each sensor pixel PS.

At least a portion of a partition wall SP surrounding each sensor pixel PS may overlap the second light emitting layers 651b of the second subpixels PX2. That is, the partition wall SP crosses deposition areas of the second light emitting layers 651b on a pixel defining layer PDL.

Referring to an arrow 1101 in FIG. 11, the second light emitting layer 651b of a second subpixel PX2 located on one side of a partition wall SP adjacent to the second subpixel PX2 (e.g., on a left side of the partition wall SP in FIG. 11) extends along an upper surface of the pixel defining layer PDL to one side of the partition wall SP. That is, the second light emitting layer 651b extends on the pixel defining layer PDL to a boundary portion of one side of the partition wall SP adjacent to the second subpixel PX2.

Since the partition wall SP crosses the deposition area of the second light emitting layer 651b on the pixel defining layer PDL, a dummy organic material DM_651b formed through the same process as the second light emitting layer 651b is disposed on the partition wall SP. The dummy organic material DM_651b is separated from the second light emitting layer 651b disposed on the one side of the partition wall SP (e.g., the left side of the partition wall SP in FIG. 11).

In addition, the dummy organic material DM_651b formed through the same process as the second light emitting layer 651b is disposed on the pixel defining layer PDL on the other side of the partition wall SP adjacent to a sensor pixel PS (e.g., on a right side of the partition wall SP in FIG. 11). The dummy organic material DM_651b disposed on the other side of the partition wall SP is disconnected from the dummy organic material DM_651b disposed on the partition wall SP. In addition, the dummy organic material DM_651b disposed on the other side of the partition wall SP is disconnected from the second light emitting layer 651b disposed on the one side of the partition wall SP (e.g., the left side of the partition wall SP in FIG. 11). Therefore, the dummy organic material DM_651b disposed on the other side of the partition wall SP does not substantially emit light.

Referring to an arrow 1002 in FIG. 11, the second light emitting layer 651b disposed on the other side of the partition wall SP overlaps a portion of the photoelectric conversion layer 652 of the sensor pixel PS on the pixel defining layer PDL. That is, the second light emitting layer 651b disposed on the other side of the partition wall SP may overlap the green overlap area 1002, which is a portion of the photoelectric conversion layer 652 on the pixel defining layer PDL.

Figure 12:
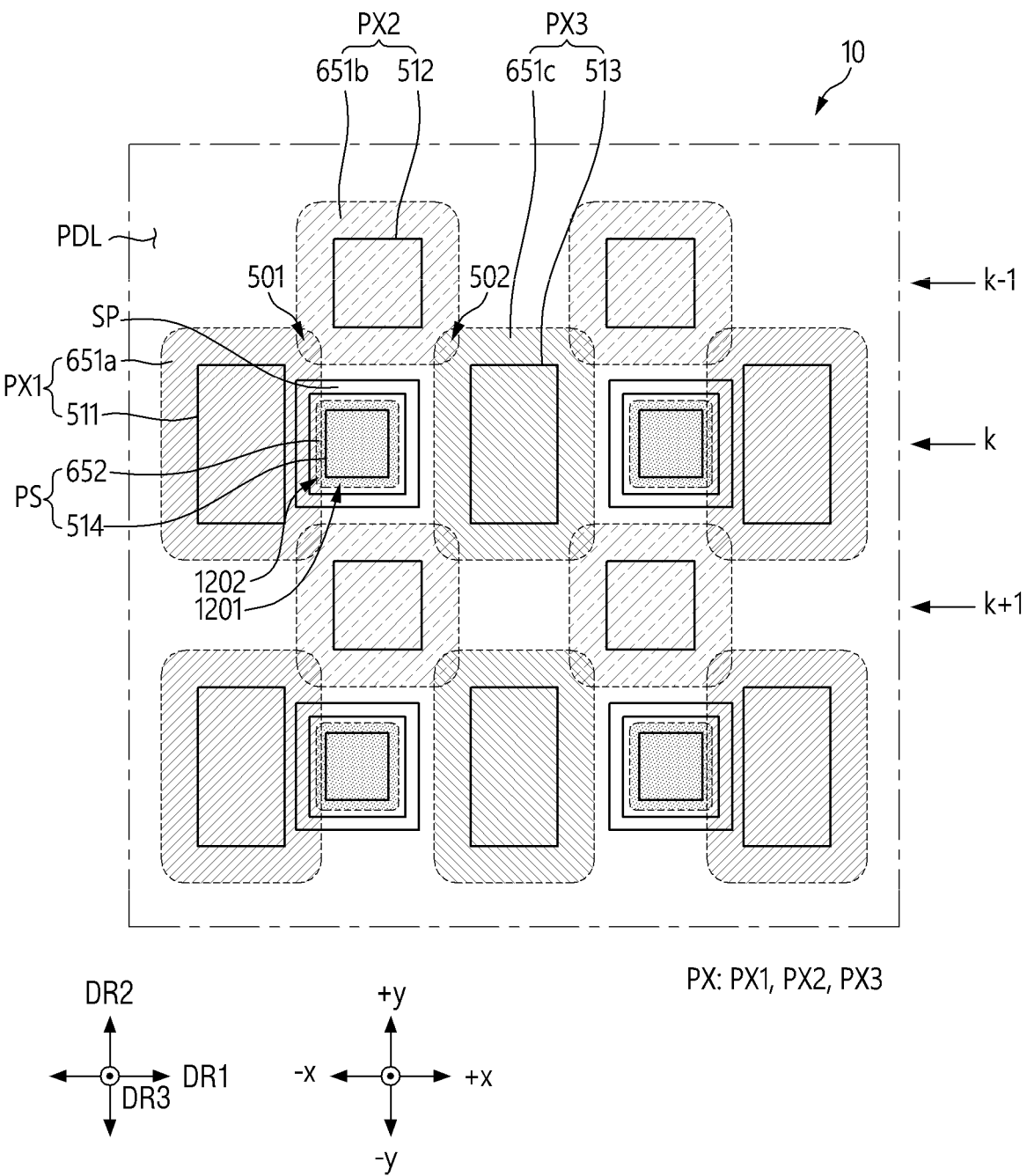
FIG. 12 is a plan view of a display panel in which at least a portion of each photosensor overlaps a first subpixel according to an embodiment.

FIG. 12 is a plan view of a display panel in which at least a portion of each photosensor overlaps a first subpixel PX1 according to an embodiment.

The embodiment of FIG. 12 may be similar to the embodiment of FIGS. 10 and 11. The following description will focus only on differences of the embodiment of FIG. 12 from the embodiment of FIGS. 10 and 11. Therefore, a description of features not described in FIG. 12 will be replaced with the description of the embodiment of FIGS. 10 and 11.

The embodiment of FIG. 12 is different from the embodiment of FIGS. 10 and 11 in that at least a portion of a photoelectric conversion layer 652 of each sensor pixel PS overlaps a portion of a first light emitting layer 651a of a first subpixel PX1.

Referring to FIG. 12, at least a portion of the photoelectric conversion layer 652 of each sensor pixel PS overlaps the first light emitting layer 651a of a first subpixel PX1 on a pixel defining layer PDL. For example, the photoelectric conversion layer 652 of each sensor pixel PS includes a red overlap area 1202 overlapping a portion of the first light emitting layer 651a of a first subpixel PX1 and a non-overlap area 1201 other than the red overlap area 1202. The red overlap area 1202 may overlap a portion of the first light emitting layer 651a of a first subpixel PX1 located in the −x direction from each sensor pixel PS.

At least a portion of a partition wall SP surrounding each sensor pixel PS may overlap the first light emitting layer 651a of a first subpixel PX1. That is, the partition wall SP crosses a deposition area of the first light emitting layer 651a on the pixel defining layer PDL.

Since the partition wall SP crosses the deposition area of the first light emitting layer 651a on the pixel defining layer PDL, a dummy organic material (not illustrated) formed through the same process as the first light emitting layer 651a is disposed on the partition wall SP. The dummy organic material is separated from the first light emitting layer 651a of the first subpixel PX1.

In the embodiment of FIG. 12, unlike in the embodiment of FIGS. 5 and 6, the area of the fourth open area 514 corresponding to a light sensing area of each sensor pixel PS increases, thus improving sensing performance.

Figure 13:
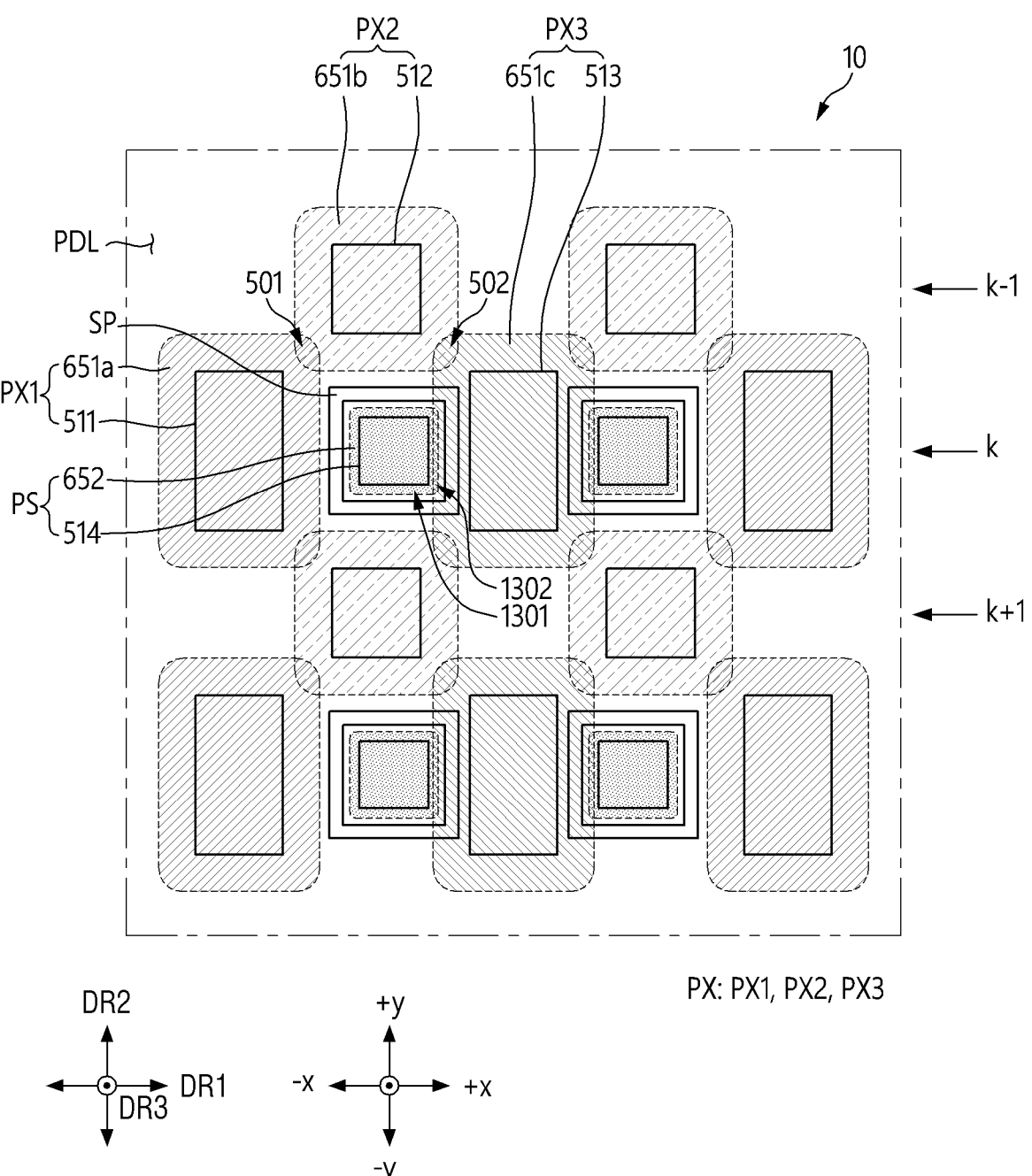
FIG. 13 is a plan view of a display panel in which at least a portion of each photosensor overlaps a third subpixel according to an embodiment.

FIG. 13 is a plan view of a display panel in which at least a portion of each photosensor overlaps a third subpixel PX3 according to an embodiment.

The embodiment of FIG. 13 may be similar to the embodiment of FIGS. 10 and 11. The following description will focus only on differences of the embodiment of FIG. 13 from the embodiment of FIGS. 10 and 11. Therefore, a description of features not described in FIG. 13 will be replaced with the description of the embodiment of FIGS. 10 and 11.

The embodiment of FIG. 13 is different from the embodiment of FIGS. 10 and 11 in that at least a portion of a photoelectric conversion layer 652 of each sensor pixel PS overlaps a portion of a third light emitting layer 651c of a third subpixel PX3.

Referring to FIG. 13, at least a portion of the photoelectric conversion layer 652 of each sensor pixel PS overlaps a portion of the third light emitting layer 651c of a third subpixel PX3 on a pixel defining layer PDL. For example, the photoelectric conversion layer 652 of each sensor pixel PS includes a blue overlap area 1302 overlapping a portion of the third light emitting layer 651c of a third subpixel PX3 and a non-overlap area 1301 other than the blue overlap area 1302. The blue overlap area 1302 may overlap a portion of the third light emitting layer 651c of a third subpixel PX3 located in the +x direction from each sensor pixel PS.

At least a portion of a partition wall SP surrounding each sensor pixel PS may overlap the third light emitting layer 651c of a third subpixel PX3. That is, the partition wall SP crosses a deposition area of the third light emitting layer 651c on the pixel defining layer PDL.

Since the partition wall SP crosses the deposition area of the third light emitting layer 651c on the pixel defining layer PDL, a dummy organic material (not illustrated) formed through the same process as the third light emitting layer 651c is disposed on the partition wall SP. The dummy organic material is disconnected from the third light emitting layer 651c of the third subpixel PX3.

In the embodiment of FIG. 13, unlike in the embodiment of FIGS. 5 and 6, the area of a fourth open area 514 corresponding to a light sensing area of each sensor pixel PS increases, thus improving sensing performance.

Figure 14:
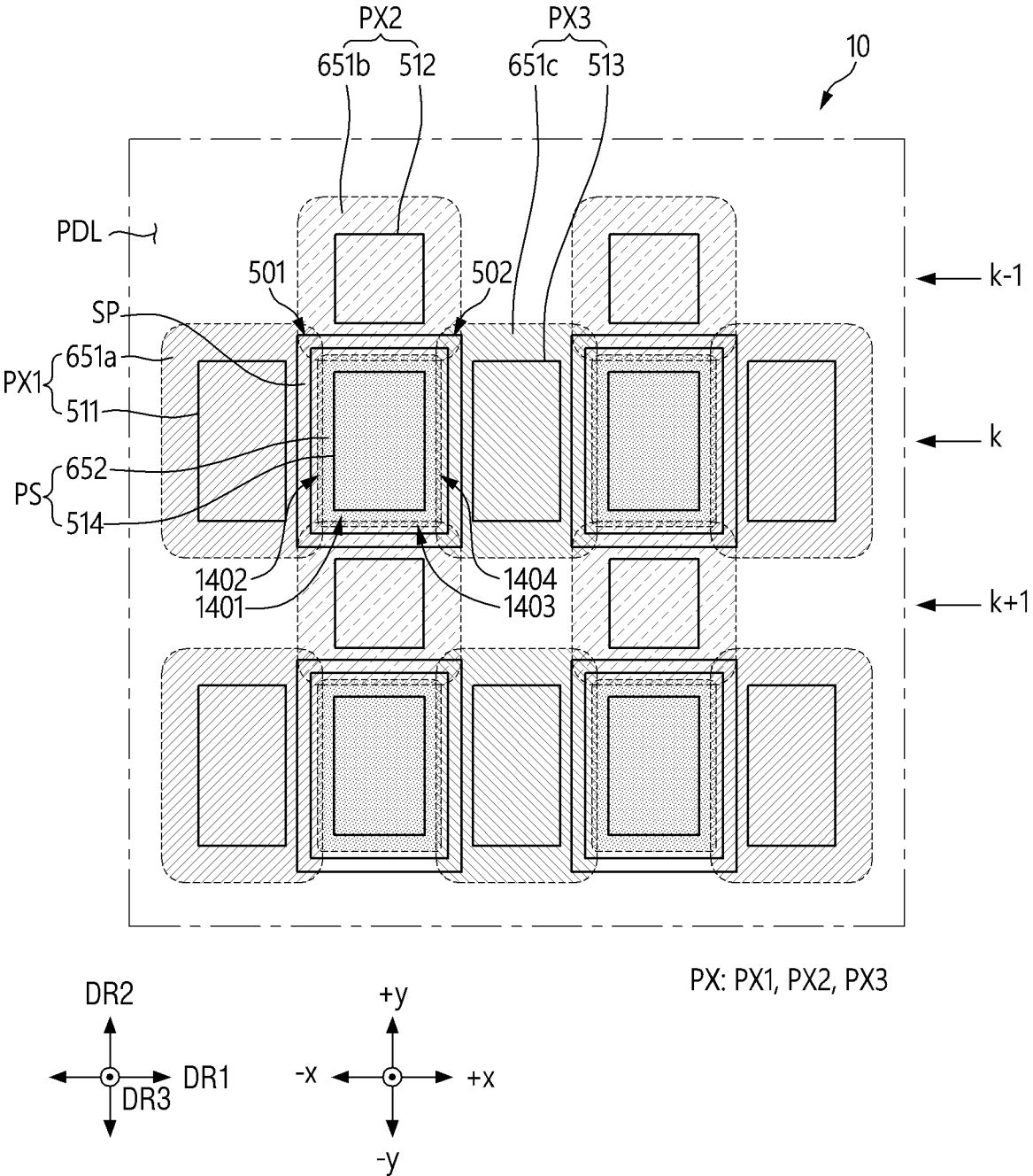
FIG. 14 is a plan view of a display panel in which at least a portion of each photosensor overlaps first through third subpixels according to an embodiment.

FIG. 14 is a plan view of a display panel in which at least a portion of each photosensor overlaps first through third subpixels PX1 through PX3 according to an embodiment.

The embodiment of FIG. 14 may be similar to the embodiment of FIGS. 10 and 11. The following description will focus only on differences of the embodiment of FIG. 14 from the embodiment of FIGS. 10 and 11. Therefore, a description of features not described in FIG. 14 will be replaced with the description of the embodiment of FIGS. 10 and 11.

The embodiment of FIG. 14 is different from the embodiment of FIGS. 10 and 11 in that at least a portion of a photoelectric conversion layer 652 of each sensor pixel PS overlaps not only second light emitting layers 651b of second subpixels PX2 but also a first light emitting layer 651a of a first subpixel PX1 and a third light emitting layer 651c of a third subpixel PX3.

The photoelectric conversion layer 652 of each sensor pixel PS includes a red overlap area 1402 overlapping a portion of the first light emitting layer 651a of a first subpixel PX1 on a pixel defining layer PDL.

The photoelectric conversion layer 652 of each sensor pixel PS further includes a green overlap area 1403 overlapping portions of the second light emitting layers 651b of second subpixels PX2 on the pixel defining layer PDL.

The photoelectric conversion layer 652 of each sensor pixel PS further includes a blue overlap area 1404 overlapping a portion of the third light emitting layer 651c of a third subpixel PX3 on the pixel defining layer PDL.

The photoelectric conversion layer 652 of each sensor pixel PS further includes a non-overlap area 1401 other than the red overlap area 1402, the green overlap area 1403, and the blue overlap area 1404.

A portion of a partition wall SP surrounding each sensor pixel PS crosses a deposition area of the first light emitting layer 651a, deposition areas of the second light emitting layers 651b, and a deposition area of the third light emitting layer 651c on the pixel defining layer PDL. A dummy organic material (not illustrated) formed through the same process as any one of the first light emitting layer 651a, the second light emitting layers 651b, and the third light emitting layer 651c is disposed on the partition wall SP. The dummy organic material may be disconnected from the first light emitting layer 651a, the second light emitting layers 651b, and the third light emitting layer 651c.

In the embodiment of FIG. 14, unlike in the embodiment of FIGS. 5 and 6, the area of a fourth open area 514 corresponding to a light sensing area of each sensor pixel PS increases, thus improving sensing performance.

In a display device and a mobile electronic device including the same according to embodiments, portability and convenience can be improved by embedding a photosensor in a display panel.

In addition, sensing performance can be improved by reducing a leakage current between a photosensor and a pixel adjacent to the photosensor.

However, the effects of the present disclosure are not restricted to the one set forth herein. The above and other effects of the present disclosure will become more apparent to one of daily skill in the art to which the present disclosure pertains by referencing the claims.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising a display panel which comprises a display area and a non-display area, wherein the display panel comprises:

a first subpixel comprising a first light emitting area;

a second subpixel comprising a second light emitting area;

a third subpixel comprising a third light emitting area;

a sensor pixel comprising a light sensing area;

a pixel defining layer separating the first light emitting area, a second light emitting area, a third light emitting area, and the light sensing area; and a partition wall disposed on the pixel defining layer to completely surround the sensor pixel and not to completely surround at least one of the first subpixel, the second subpixel and the third subpixel.

2. The display device of claim 1, wherein the first subpixel comprises a first light emitting layer disposed in the first light emitting area and on a portion of the pixel defining layer adjacent to the first light emitting area, the second subpixel comprises a second light emitting layer disposed in the second light emitting area and on a portion of the pixel defining layer adjacent to the second light emitting area, the third subpixel comprises a third light emitting layer disposed in the third light emitting area and on a portion of the pixel defining layer adjacent to the third light emitting area, and the sensor pixel comprises a photoelectric conversion layer disposed in the light sensing area and on a portion of the pixel defining layer adjacent to the light sensing area.

3. The display device of claim 1, wherein the first subpixel, the second subpixel and the third subpixel are repeatedly arranged along a first direction and a second direction to be arranged in a matrix form, and the sensor pixel is disposed adjacent to the first subpixel, the second subpixel and the third subpixel and detects a user's biometric information using at least one of red light emitted from the first subpixel, green light emitted from the second subpixel, and blue light emitted from the third subpixel.

4. The display device of claim 3, wherein the biometric information comprises fingerprint information, iris information, blood pressure information, and blood flow information.

5. The display device of claim 4, wherein the first subpixel and the third subpixel are alternately arranged in a k-th row along a first direction, the second subpixels are arranged in each of (k−1)-th and (k+1)-th rows along the first direction, and the sensor pixel is disposed between the first subpixel and the third subpixel in the k-th row.

6. The display device of claim 5, wherein the second subpixel and the sensor pixel are alternately arranged in a column along a second direction perpendicular to the first direction.

7. The display device of claim 6, wherein the sensor pixel detects the blood pressure information and the blood flow information using the red light emitted from the first subpixel and the blue light emitted from the third subpixel.

8. The display device of claim 6, wherein the sensor pixel detects the fingerprint information using the green light emitted from the second subpixel.

9. The display device of claim 8, wherein the partition wall surrounding the sensor pixel has a uniform height.

10. The display device of claim 2, wherein the photoelectric conversion layer of the sensor pixel comprises a green overlap area overlapping a portion of the second light emitting layer on the pixel defining layer and a non-overlap area other than the green overlap area.

11. The display device of claim 10, wherein a portion of the partition wall crosses a deposition area of the second light emitting layer on the pixel defining layer and a dummy organic material formed through the same process as the second light emitting layer is disposed on the portion of the partition wall.

12. The display device of claim 11, wherein a cathode is disposed on the dummy organic material on the partition wall, and the cathode located on the partition wall is connected to the cathode disposed in the first through third light emitting areas and the light sensing area.

13. A mobile electronic device comprising a display panel in which a photosensor is embedded, wherein the display panel comprises:

a first subpixel comprising a first light emitting area;

a second subpixel comprising a second light emitting area;

a third subpixel comprising a third light emitting area;

a sensor pixel comprising a light sensing area;

a pixel defining layer separating the first light emitting area, the second light emitting area, the third light emitting area, and the light sensing area; and a partition wall disposed on the pixel defining layer to completely surround the sensor pixel and not to completely surround at least one of the first subpixel, the second subpixel and the third subpixel.

14. The mobile electronic device of claim 13, wherein the first subpixel comprises a first light emitting layer disposed in the first light emitting area and on a portion of the pixel defining layer adjacent to the first light emitting area, the second subpixel comprises a second light emitting layer disposed in the second light emitting area and on a portion of the pixel defining layer adjacent to the second light emitting area, the third subpixel comprises a third light emitting layer disposed in the third light emitting area and on a portion of the pixel defining layer adjacent to the third light emitting area, and the sensor pixel comprises a photoelectric conversion layer disposed in the light sensing area and on a portion of the pixel defining layer adjacent to the light sensing area.

15. The mobile electronic device of claim 13, wherein the first subpixel, the second subpixel, and the through third subpixel are repeatedly arranged along a first direction and a second direction to be arranged in a matrix form, and the sensor pixel is disposed adjacent to the first subpixel, the second subpixel, and the third subpixel and detects a user's biometric information using at least one of red light emitted from the first subpixel, green light emitted from the second subpixel, and blue light emitted from the third subpixel.

16. The mobile electronic device of claim 15, wherein the first subpixel and the third subpixel are alternately arranged in a k-th row along a first direction, the second subpixels are arranged in each of (k−1)-th and (k+1)-th rows along the first direction, and the sensor pixel is disposed between the first subpixel and the third subpixel in the k-th row.

17. The mobile electronic device of claim 16, wherein the sensor pixel comprises a first sensor pixel which detects blood pressure information and blood flow information using the red light emitted from the first subpixel and the blue light emitted from the third subpixel.

18. A display device comprising a display panel which comprises a display area and a non-display area, wherein the display panel comprises:

a first subpixel comprising a first light emitting area disposed in a k-th row;

a second subpixel comprising a second light emitting area;

a third subpixel comprising a third light emitting area disposed in the k-th row;

a sensor pixel comprising a light sensing area;

a pixel defining layer separating the first light emitting area, a second light emitting area, a through third light emitting areas, and the light sensing area; and a partition wall disposed on the pixel defining layer to surround the sensor pixel, wherein the partition wall includes a first partition wall portion disposed on the pixel defining layer between a portion of the photoelectric conversion layer of the sensor pixel and a portion of the first light emitting layer of the first subpixel, and a second partition wall portion disposed on the pixel defining layer between a portion of the photoelectric conversion layer of the sensor pixel and a portion of the third light emitting layer of the third subpixel, and wherein a predetermined gap is disposed between the first partition wall portion and the second partition wall portion to form a first slit disposed between the sensor pixel and the second subpixel in a (k−1)-th row and a second slit disposed between the sensor pixel and the second subpixel in a (k+1)-th row.

19. The display device of claim 18, wherein the partition wall is completely removed in areas corresponding to the first slit and the second slit.

20. The display device of claim 19, wherein the photoelectric conversion layer of the sensor pixel comprises a green overlap area overlapping a portion of the second light emitting layer on the pixel defining layer.

\* \* \* \* \*